United States Patent
Ashigaki et al.

[11] Patent Number: 5,946,591
[45] Date of Patent: *Aug. 31, 1999

[54] METHOD OF MAKING A SEMICONDUCTOR DEVICE HAVING A FLAT SURFACE

[75] Inventors: Shigeo Ashigaki, Tsuchiura, Japan; Kazuhiro Hamamoto, Plano, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/553,219

[22] Filed: Nov. 7, 1995

[30] Foreign Application Priority Data

Nov. 7, 1994 [JP] Japan .................................. 6-297926

[51] Int. Cl.$^6$ ............................................. H01L 21/4763
[52] U.S. Cl. ..................... 438/632; 438/646; 438/698; 438/253
[58] Field of Search ...................................... 437/228, 225, 437/982, 164, 52; 148/DIG. 133; 438/632, 646, 697–698, 978, 253–356, 393–399

[56] References Cited

U.S. PATENT DOCUMENTS

| | | |
|---|---|---|
| 4,962,063 | 10/1990 | Maydan et al. ........................ 437/228 |
| 5,112,776 | 5/1992 | Marks et al. ............................ 437/228 |
| 5,175,122 | 12/1992 | Wang et al. . |
| 5,268,333 | 12/1993 | Lee et al. ................................ 437/235 |
| 5,332,687 | 7/1994 | Kuroda . |

FOREIGN PATENT DOCUMENTS

0 609 551  8/1994  European Pat. Off. .

OTHER PUBLICATIONS

Motorola Technical Developments, vol. 12, Apr. 1, 1991, pp. 59–64, XP000229266, Robinson F J: "Borophosphosilicte Glass Interlevel Dielectric Planarizatio n" *p. 59, col. 1, paragraph 4—p. 60, column 2, paragraph 2** figure 3*.

*Primary Examiner*—Jey Tsai
*Attorney, Agent, or Firm*—Bret J. Petersen; William B. Kempler; Richard L. Donaldson

[57] ABSTRACT

A manufacturing method for semiconductor devices such as dynamic RAM, etc. which removes the layer part more on the high position than an arbitrary position on a step forming a gradation by just a prescribed thickness when flattening a layer with a gradation formed of a high position part and a low position part. Then the projecting part created after the etching existing more on the low position side than at the arbitrary position of the gradation is eliminated by heat treatment.

15 Claims, 23 Drawing Sheets

FIG. 1 and FIG. 2

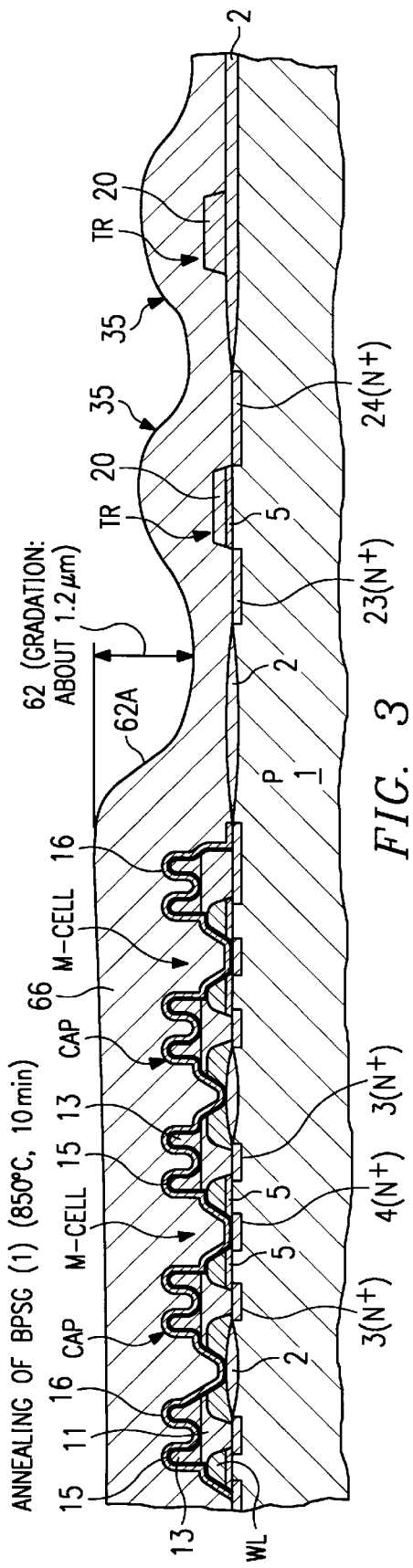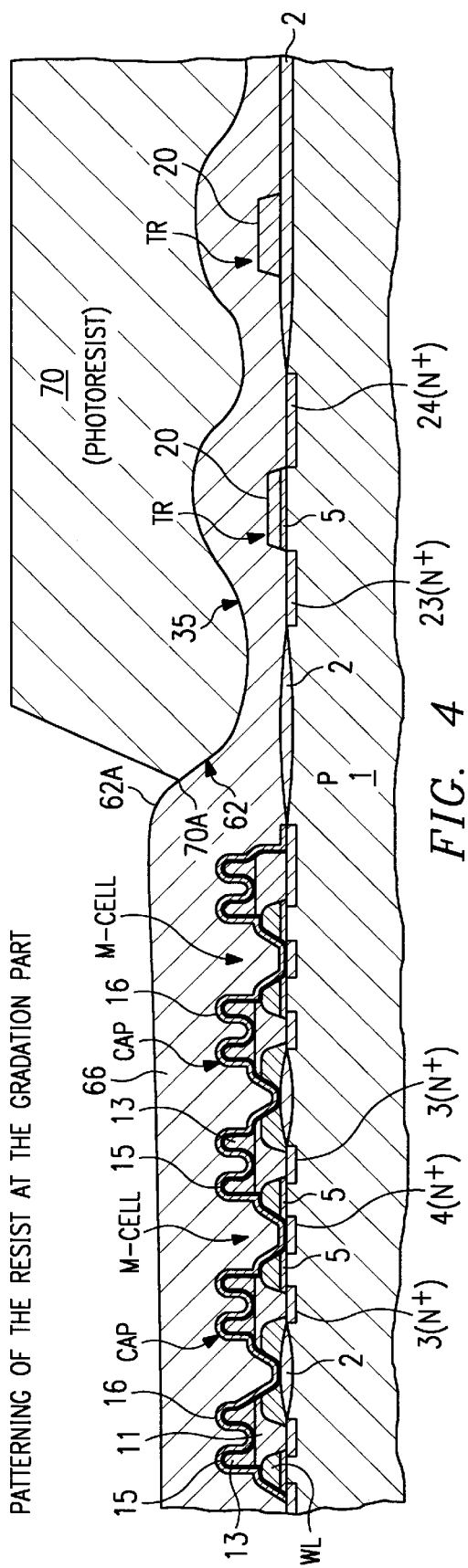

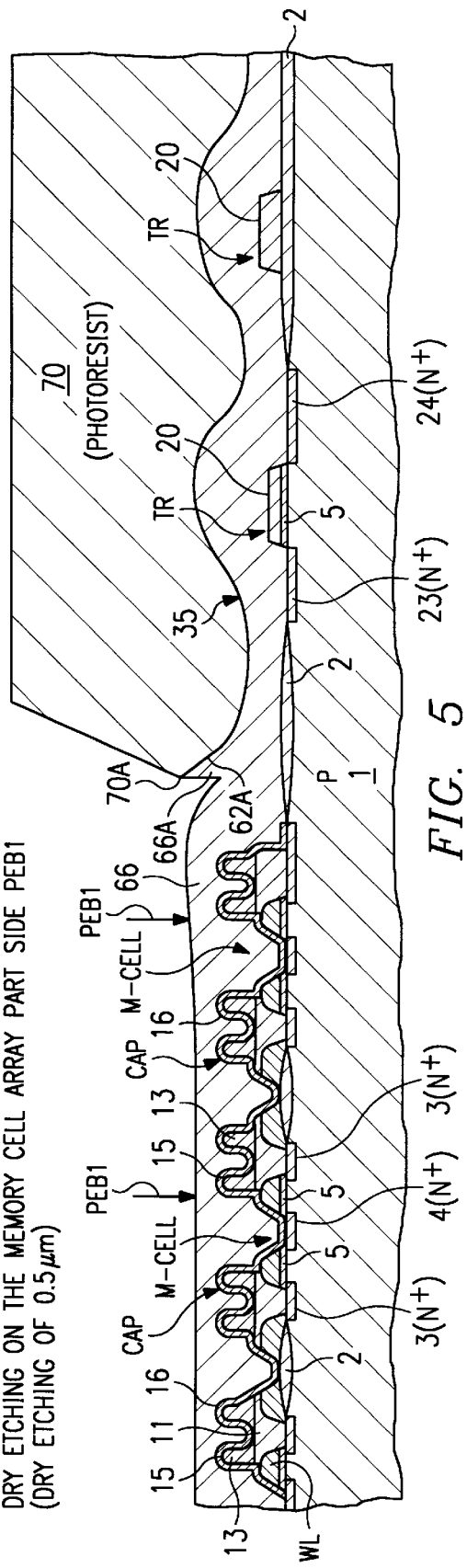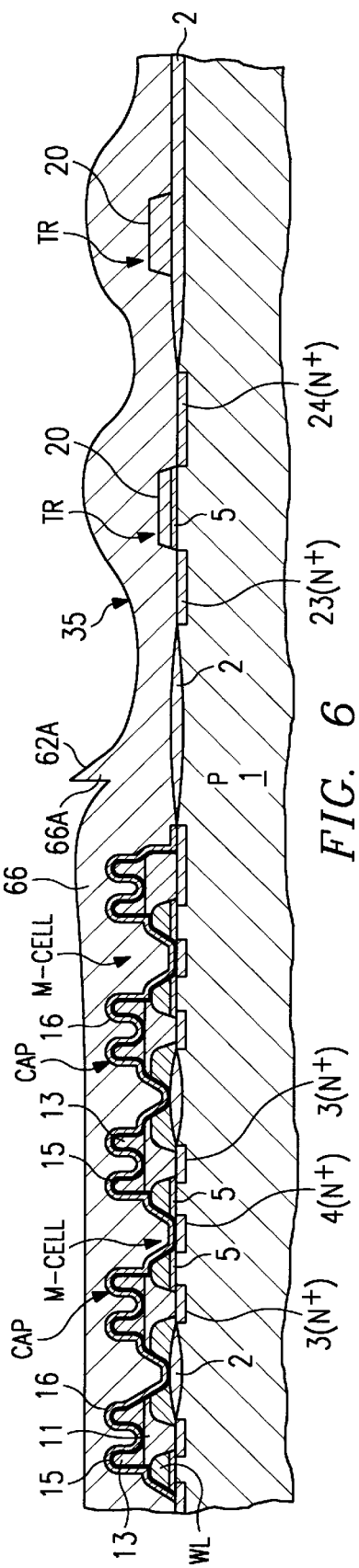

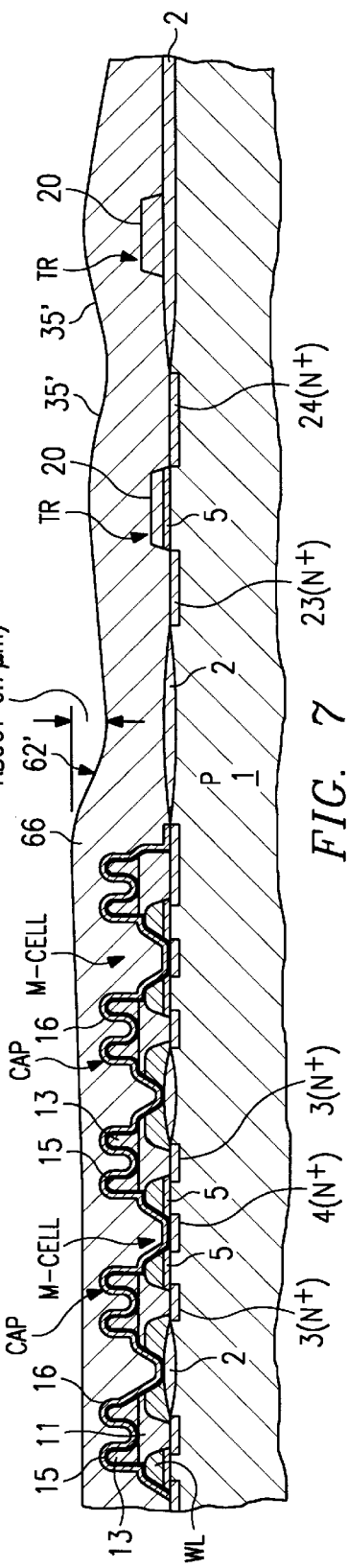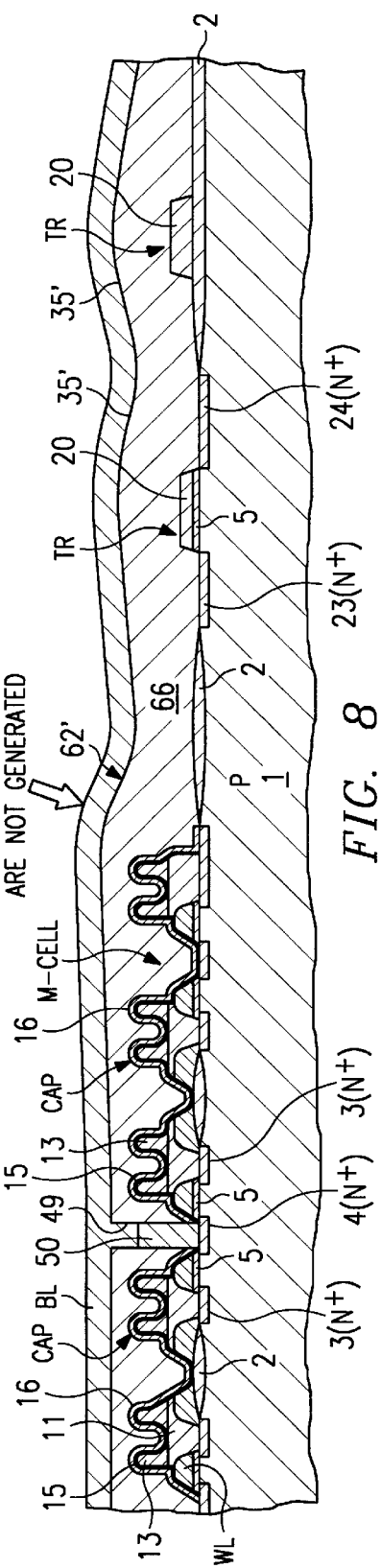

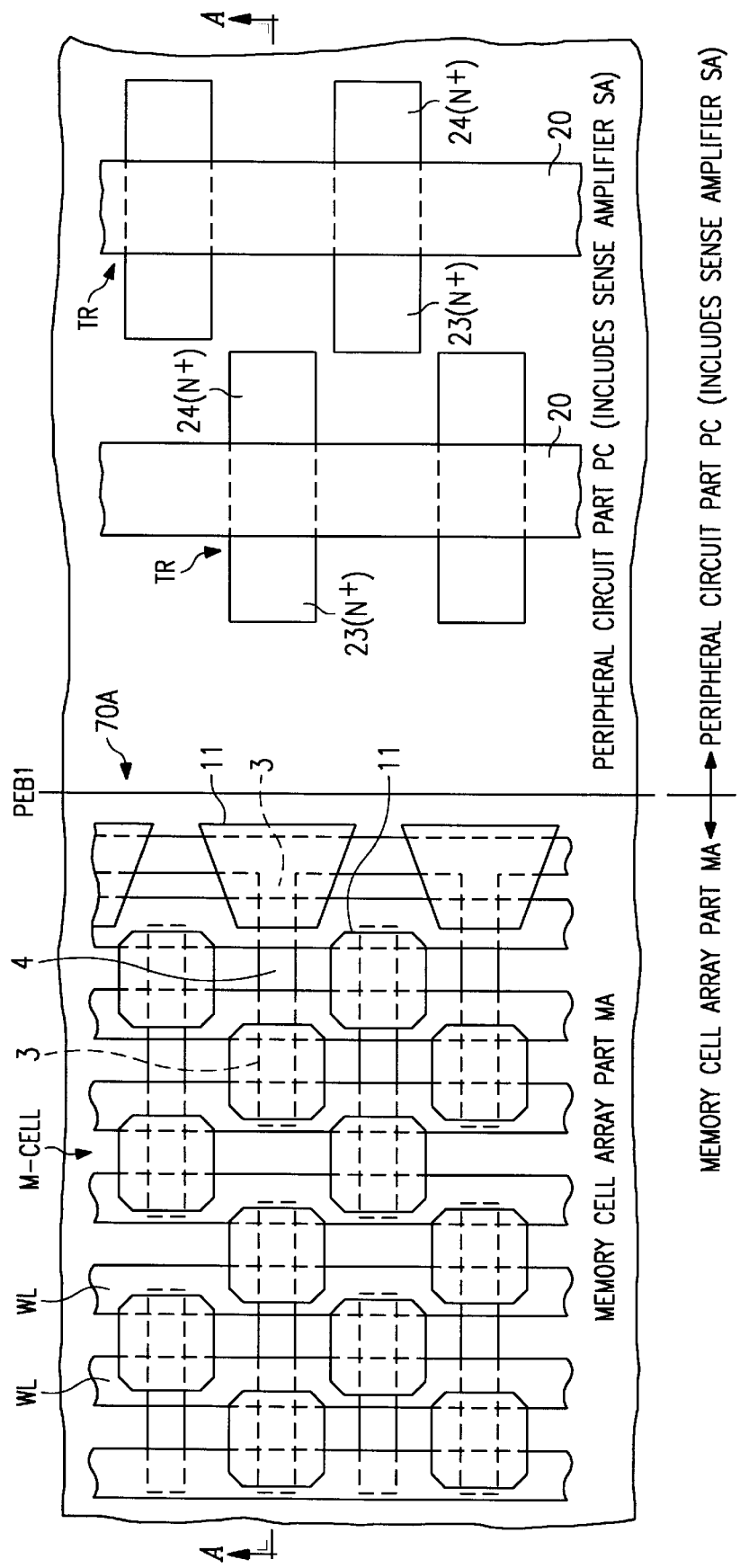

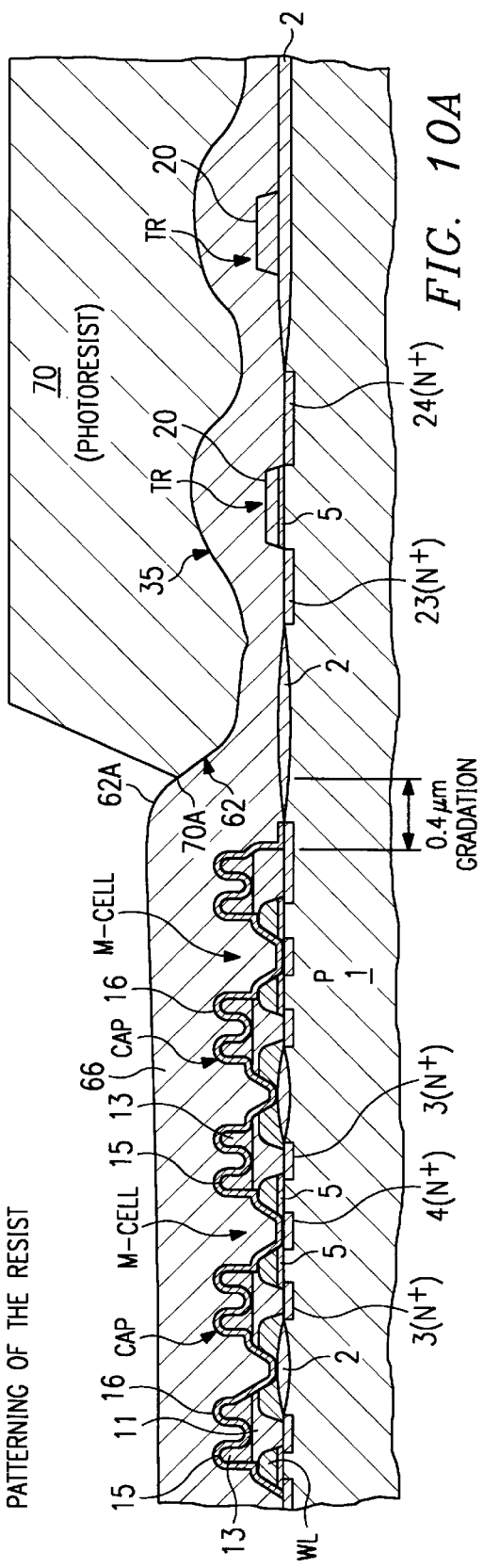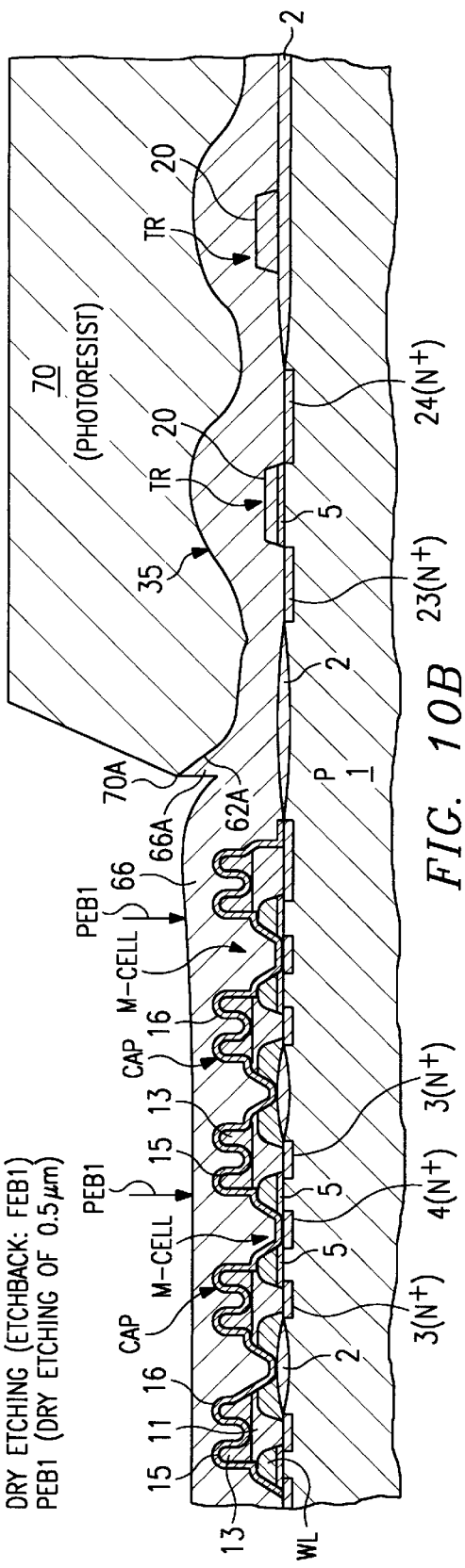

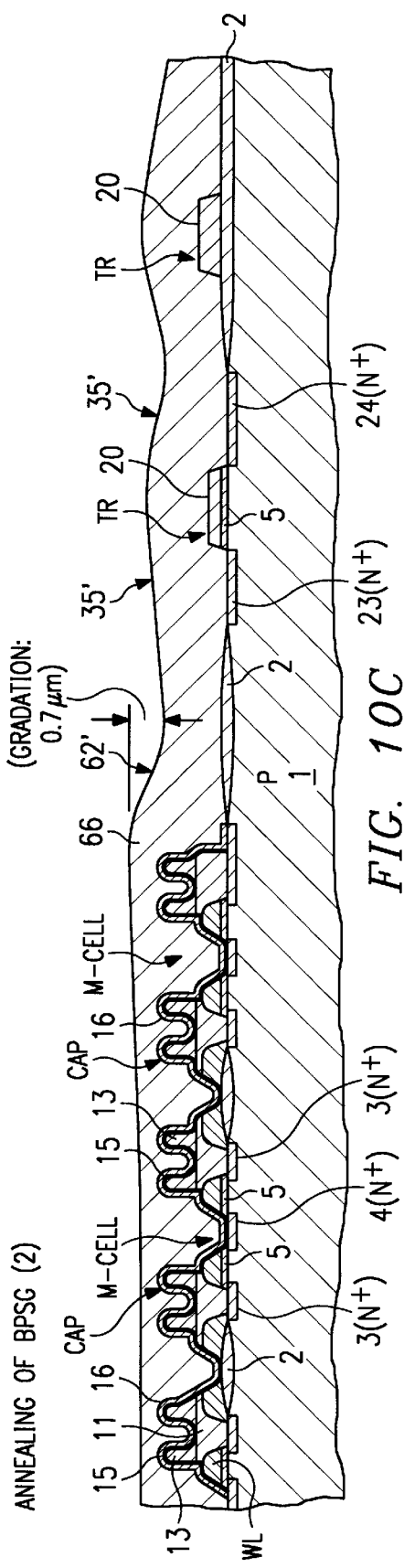
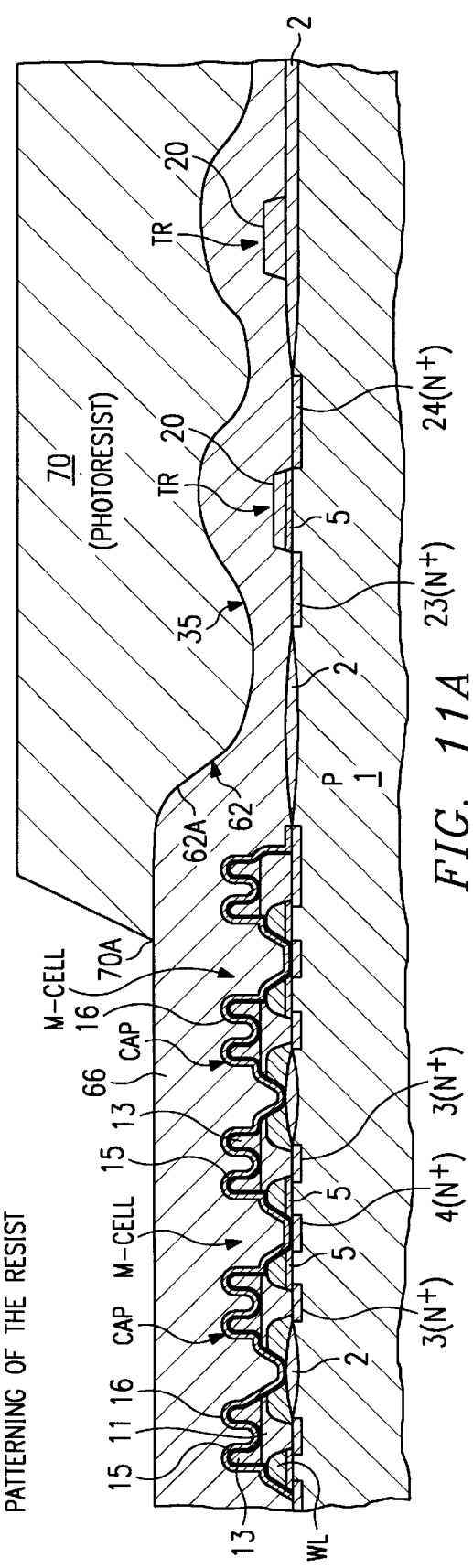

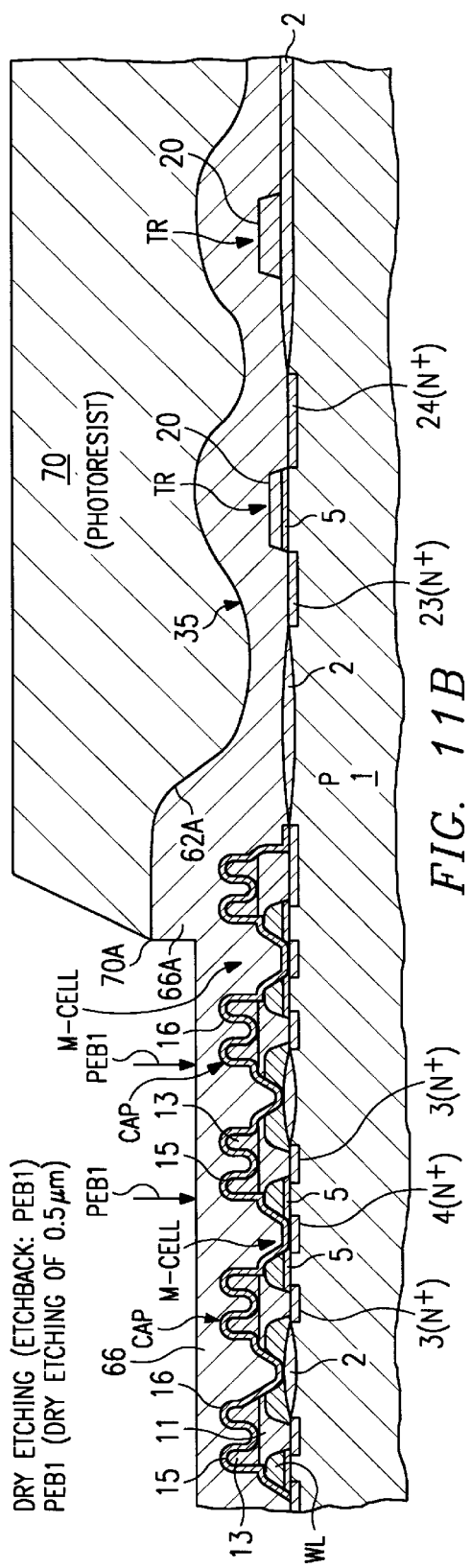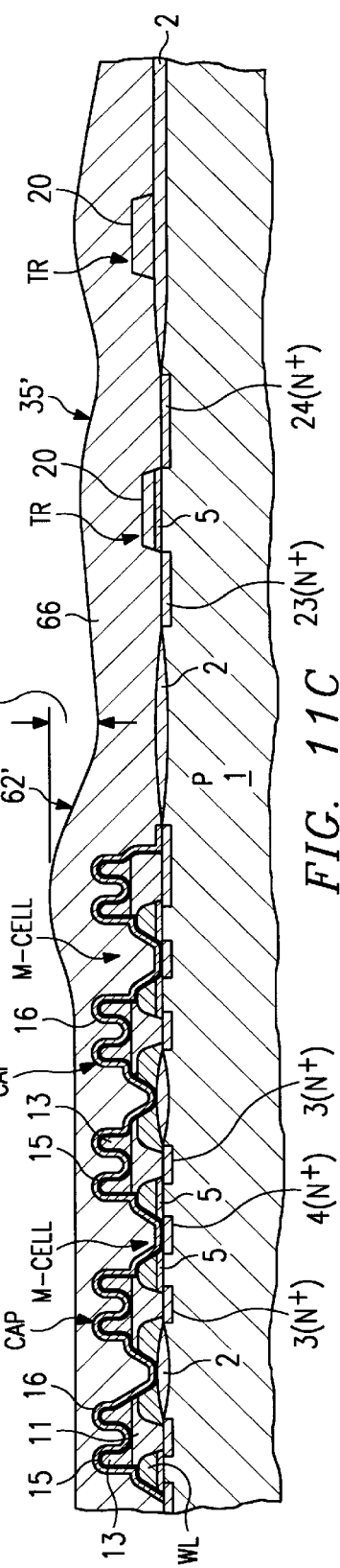

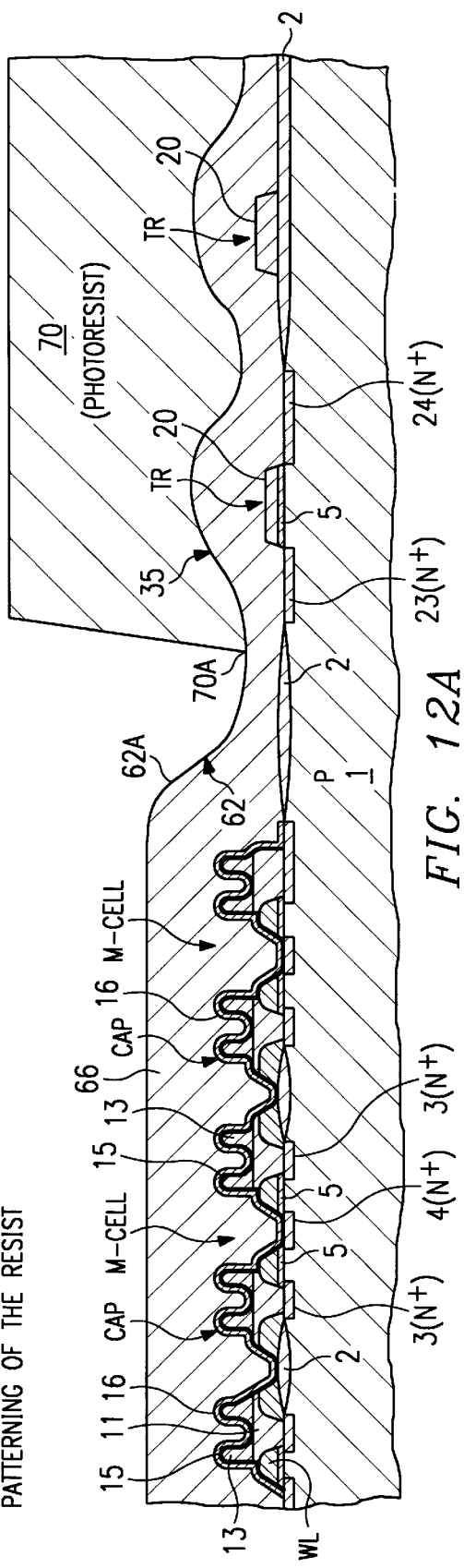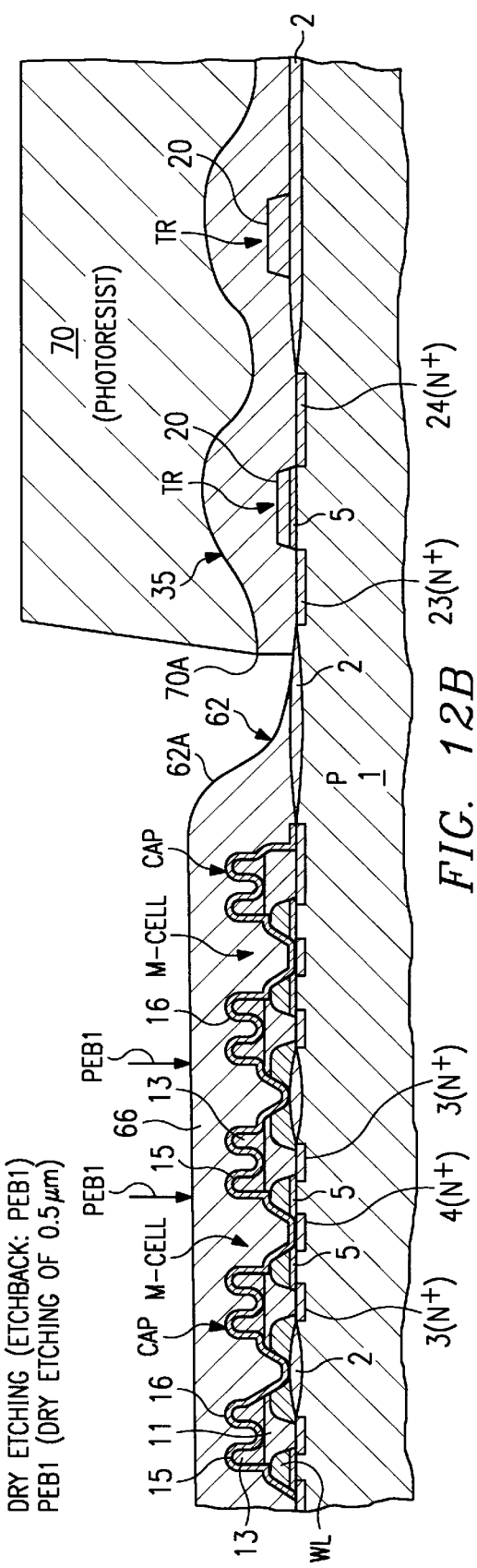

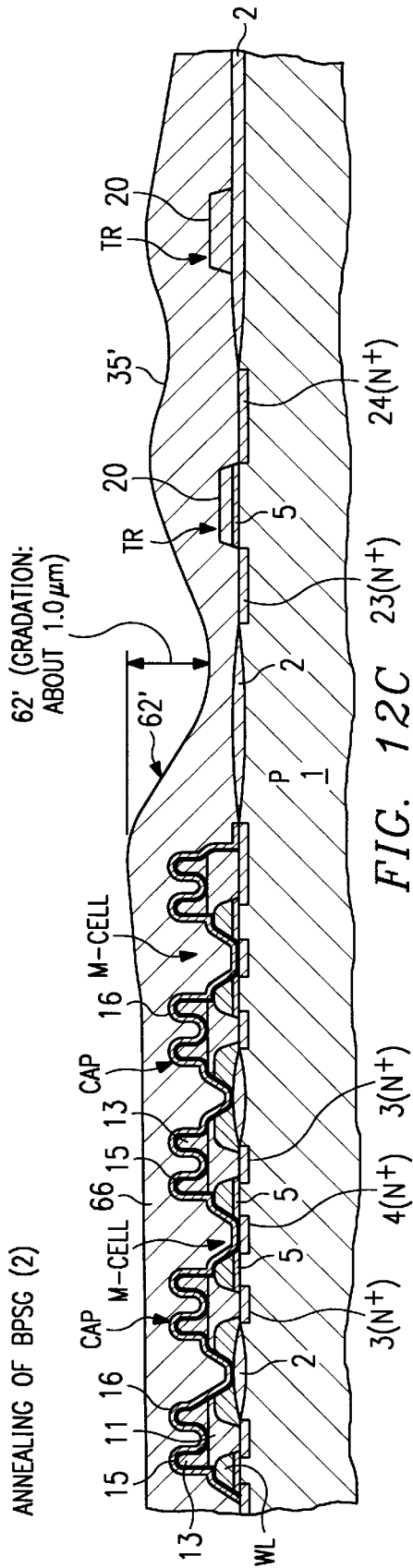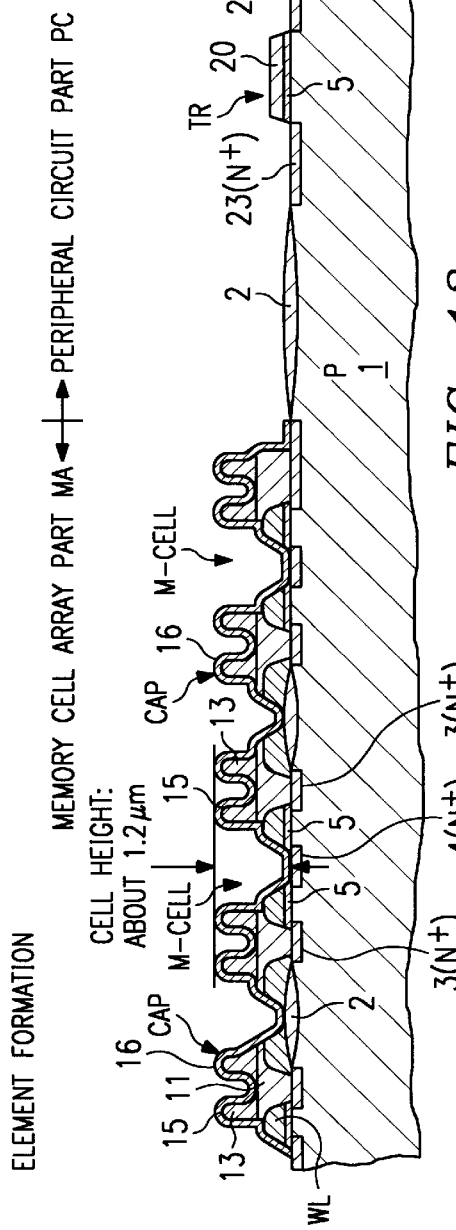

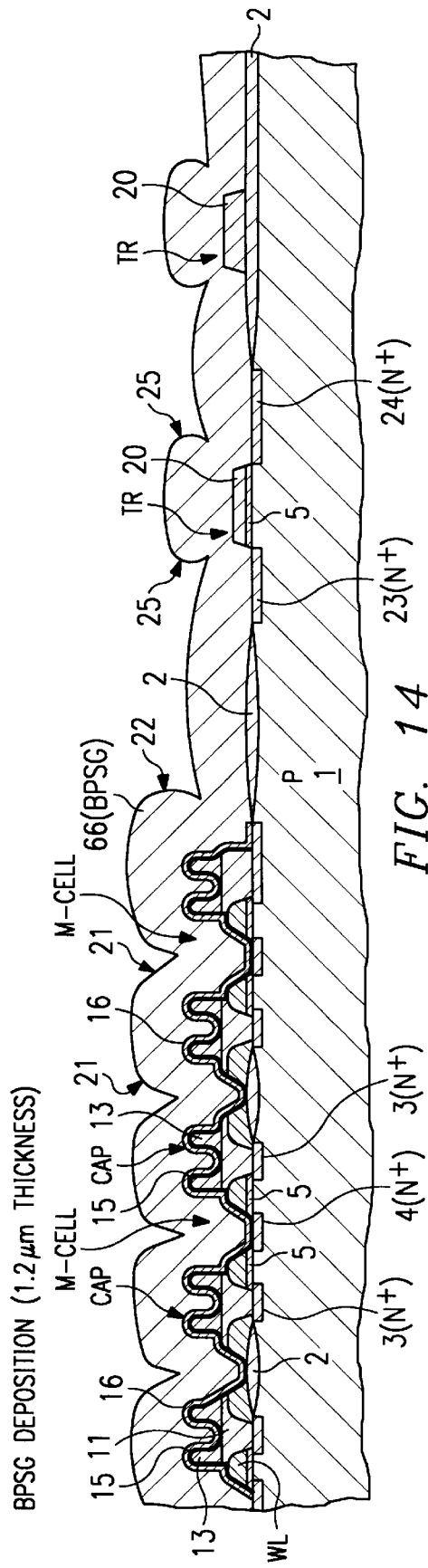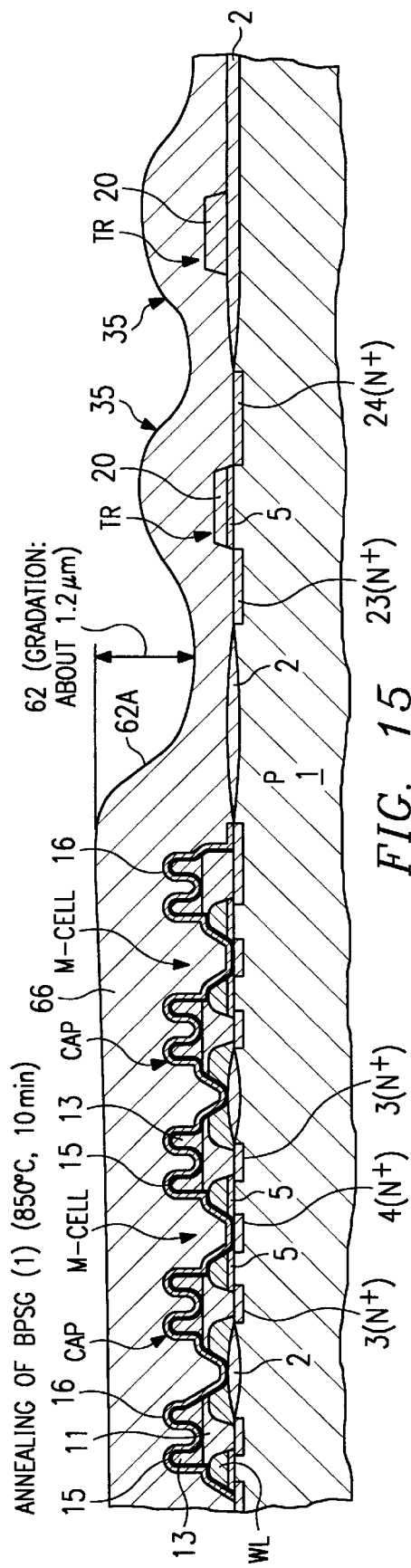

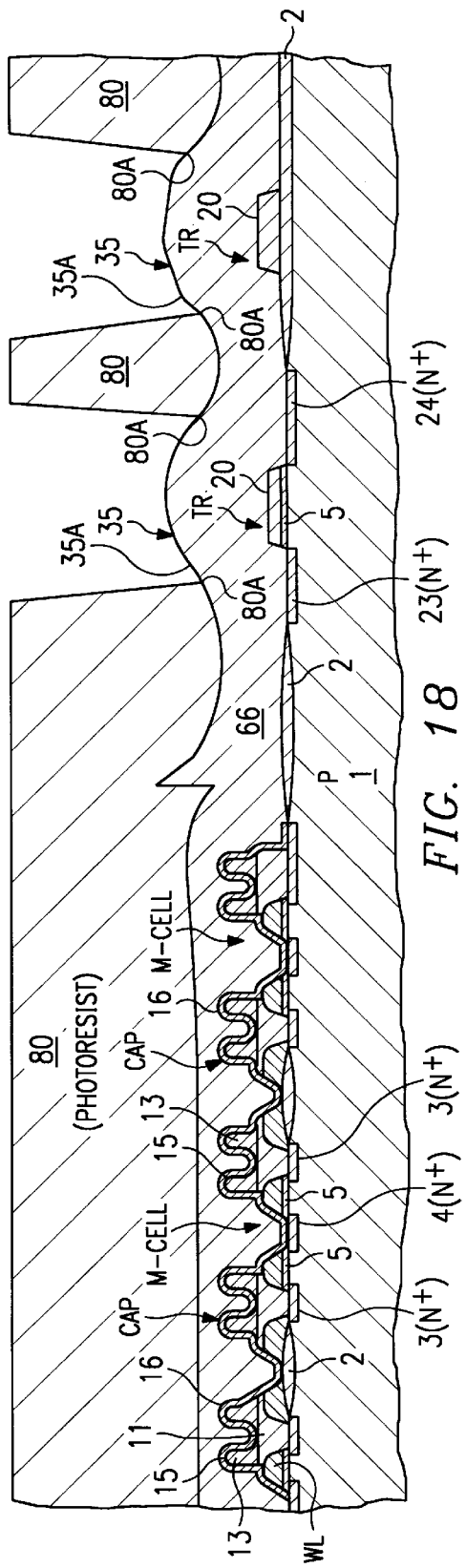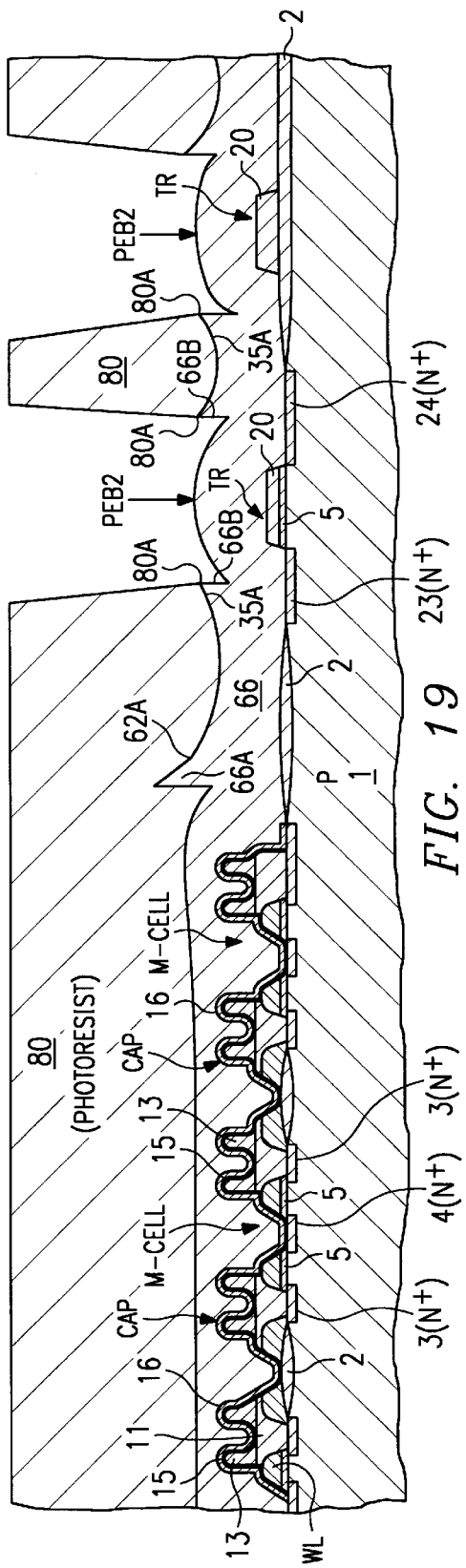

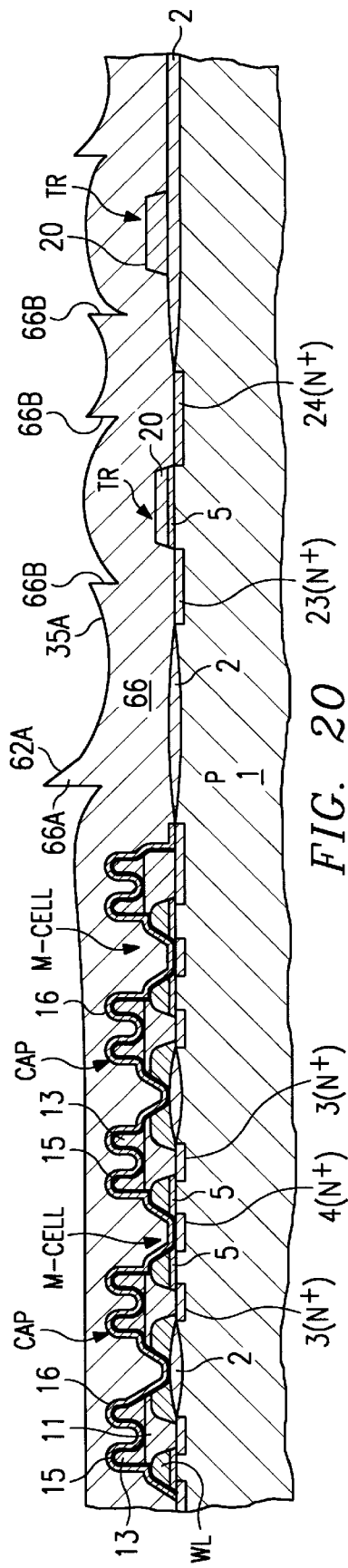
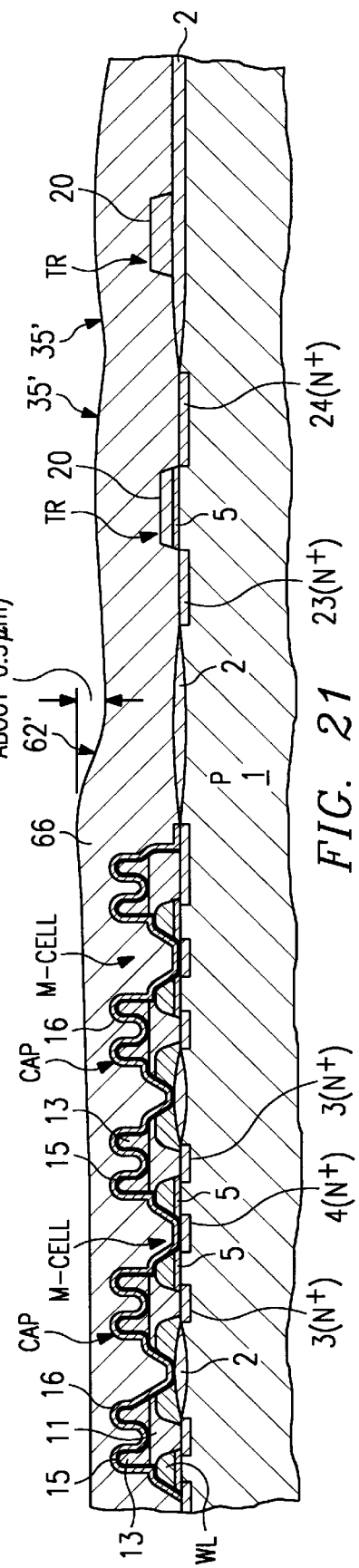

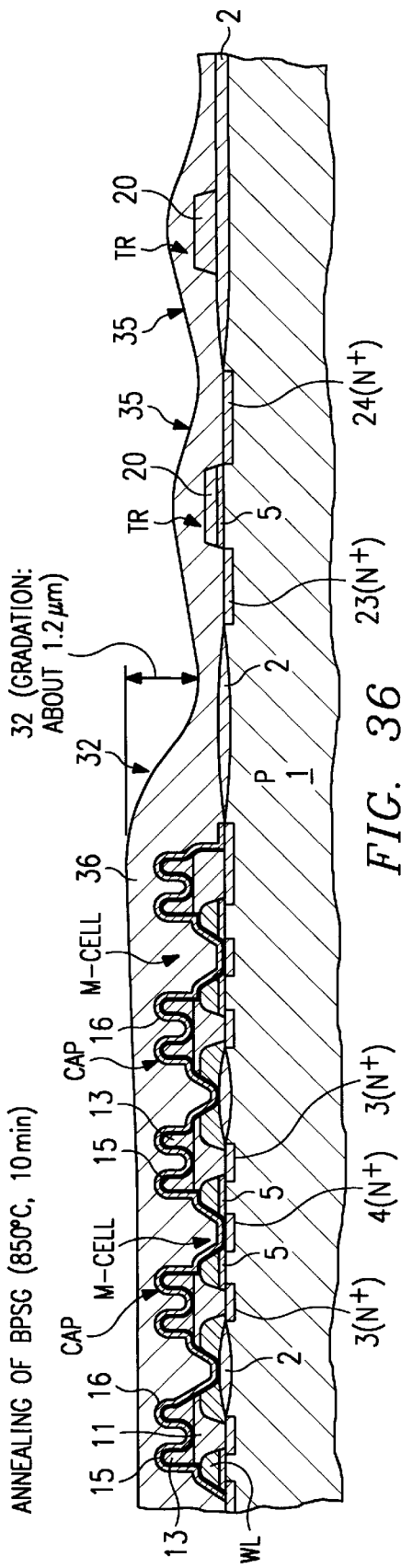
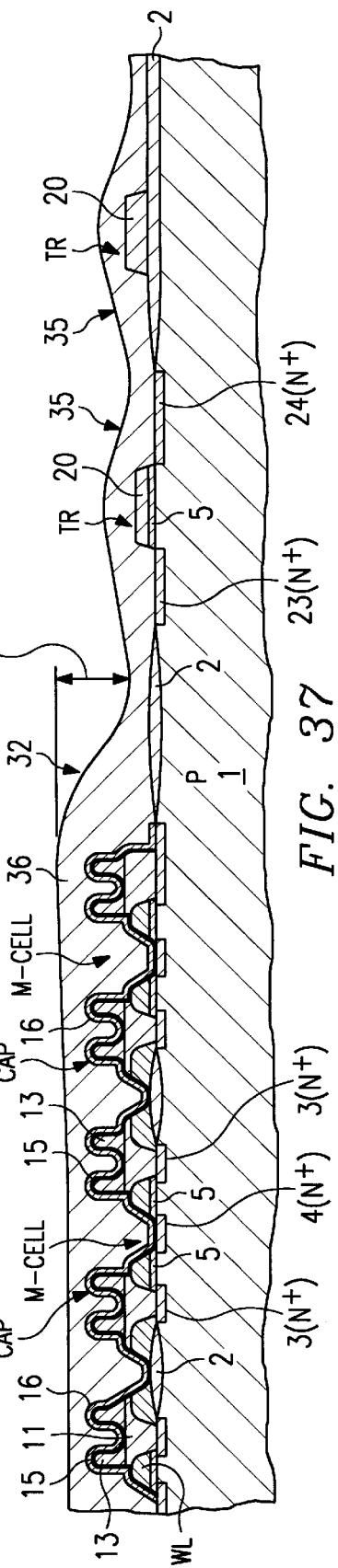

METHOD OF MAKING A SEMICONDUCTOR DEVICE HAVING A FLAT SURFACE

FIELD OF THE INVENTION

Our invention relates to a method for manufacturing semiconductor devices, and more particularly to a method of making such devices as dynamic RAMs, random access memories, etc.

BACKGROUND OF THE INVENTION

Conventionally, a dynamic RAM, for example, a dynamic RAM with a stacked cell capacitor formed into a cylindrical shape to increase the capacitance, has a memory cell with the structure shown in FIG. 38. A gate oxide film 5 is formed in the element region formed of a field $SiO_2$ film 2 on p-type silicon substrate 1 and on this a polysilicon word line WL and a $SiO_2$ layer 6 are formed, then $n^+$-type semiconductor regions 3 (source region) and 4 (drain region) are formed by a self-alignment method which masks the word line WL.

Then, a $SiO_2$ layer 7 for passivation and a $Si_3N_4$ layer 8 and a $SiO_2$ layer 9 for substrate protection are successively formed on the entire surface, a contact hole 10 is formed in one part of the laminated film on $n^+$-type source region 3, a polysilicon capacitor electrode 11 (storage node) is formed to include the contact hole 10 and to be connected to source region 3, and a cylindrical shape polysilicon layer 13 is formed on the polysilicon layer 11. Furthermore, a dielectric film, for example, $Si_3N_4$ film 15 is deposited on the entire surface and an upper capacitor electrode (plate electrode) composed of polysilicon layer 16 is formed on the $Si_3N_4$ film.

It is thus formed into a structure in which capacitor Cap with capacitance expanded by screen type polysilicon layer 13 is connected to source region 3 with the top and bottom electrodes 16 and 11 and dielectric film 15.

Also, a memory cell M-CEL of a dynamic RAM for use in, for example, 16 Mb and 64 Mb memory chips is formed by an interlayer insulation film, for example, a silicate glass (BPSG layer) 36 doped with boron and phosphorus formed on an upper electrode 16 by the CVD method, a contact hole 49 reaching a $n^+$-type drain region 4 formed in it, and a bit line BL adhered to contact hole 49 via polysilicon layer 50.

This type of dynamic RAM is generally composed of peripheral circuit part PC and memory cell array part MA having many memory cells M-CEL as shown in FIG. 34 (however, the elements in each part are shown schematically in the fig.). On the memory cell array part MA and peripheral circuit part PC, the BPSG layer 36 is formed by a process to be explained below and wiring such as bit line BL, etc. is provided.

As shown in FIG. 34, many memory cells M-CELL (the cell height is about 1.2 $\mu$m, word line space is about 0.4 $\mu$m, word line height is about 3500 Å) with associate stack cell capacitor Cap as shown in FIG. 41 are formed in an array in memory cell array part MA on one principal surface of p-type silicon substrate 1, and each MOS transistor TR constituting the input/output circuit is formed in peripheral circuit part PC. These transistors TR are composed of a structure in which polysilicon gate electrode 20 between is provided $n^+$-type source region 23 and $n^+$-type drain region 24 via gate oxide film 5.

Next, BPSG layer 36 is deposited on the entire surface of substrate 1 in thickness of 0.6 $\mu$m by the CVD method as shown in FIG. 35. On the surface of the deposition layer 36, along with concaved gradation 21 created between memory cells M-CELL due to the thickness of word line WL and the screen height of cell capacitor Cap, etc., a gradation steeper 22 than gradation 21 is created between memory cell array part MA and peripheral circuit part PC due to the lack of a high structure like a screen structure on the outside of the terminal part of memory cell array part MA (the distance between gate electrode 20 and word line WL of the memory cell is about 4 $\mu$m).

Here gradation 21 in memory cell array part MA is sometimes called a "local gradation" in the specifications of the present application but this is a gradation between multiple word lines WL (or between the cells) which are relatively close, and normally, it is created when the distance between the word lines or between the wiring is less than 10 $\mu$m.

Also, gradation 22 between memory cell array part MA and peripheral circuit part PC is sometimes called a "global gradation" in the specifications of the present application but this is quite steep and normally it is created when the distance between the word lines or between the wiring is more than 10 $\mu$m (however, in some cases it is less than 10 $\mu$m).

Gradation 25 is created on the sides of gate electrode 20 and between gate electrodes 20—20 even in peripheral circuit part PC but in this the height difference is smaller than global gradation 22 (however, a height difference equal to local gradation 21 or greater may be manifested).

These gradations 21, 22, and 25 need to be eliminated and be flattened in order to provide wiring on BPSG layer 36 with reliability. For this, reflow of BPSG layer 36 is executed by annealing for 10 minutes at 900° C. in the state shown in FIG. 35.

However, though local gradations 21 are essentially eliminated, gradation 25 of peripheral circuit part PC becomes a gentle slope like 35, and the steep shape of global gradation 22 becomes a gentle slope as shown in FIG. 36, flattening near global gradation 22 with large height difference is difficult. Namely, gradation 32 (this is also a global gradation) with a height difference of about 1.2 $\mu$m is left between memory cell array part MA and peripheral circuit part PC. When contact hole 49 is formed in the prescribed location of BPSG layer 36 and a prescribed wiring, specifically, bit line BL is formed via a polysilicon layer as shown in FIG. 37 in this state, there is a tendency for wiring BL to disconnect and short-circuit during the photolithography since the gradation is great in the location of global gradation 32. Namely, when, for example, positive type photoresist is thickly coated in the disconnected part, exposure is not possible to the bottom part of the photoresist and short-circuit occurs or the unexposed part of the photoresist is exposed by irregular reflection, etc. of light due to the step of gradation 32, the pattern width of the wiring formed by etching with photoresist deforms in a disordered pattern as a mask, and disconnection of the wiring may occur.

When this happens the reliability of the wiring becomes unfavorable, there is a limit to refining the wiring width and pitch, and this is very inconvenient for manufacturing of highly integrated semiconductor devices.

The objective of our invention is to provide a manufacturing method which can execute the flattening of the insulation layer such as the BPSG layer easily and reliably and can apply the wiring, etc. reliably and with a margin [for reliability].

SUMMARY OF INVENTION

Our invention relates to a manufacturing method for semiconductor devices such as dynamic RAM, etc. which removes the layer part more on the high position than an arbitrary position on a step forming a gradation by just a prescribed thickness when flattening a layer (e.g., BPSG layer 66 to be discussed later) with a gradation (e.g., global gradation 62 to be discussed later) formed of a high position part (e.g., the part on memory cell array part MA to be discussed later) and a low position part (e.g., the part on peripheral circuit part PC to be discussed later), then the projecting part (e.g., projecting part 66A) created after the etching to be discussed later) existing more on the low position side than at the arbitrary position of the gradation is eliminated by heat treatment.

According to the manufacturing method in our invention, reflow process is not executed as is as noted above with respect to the gradation formed of the high position part and the low position part but is heat treated after removing the layer part more on the high position side than an arbitrary position on the step forming the gradation by just a prescribed thickness so the post heat treatment can be executed having been reduced the height of the gradation and the thickness of the layer in correspondence with the reduced thickness.

Therefore, during the heat treatment, the volume (volume determined by the height, width, and length) of the projecting part existing (namely, left after removing the layer part by just a prescribed thickness) more on the low position side than the arbitrary position of the gradation is small, so the projecting part can be eliminated easily by heat treatment thus the height difference between the high position part and the low position part can be minimized noticeably and the layer can be sufficiently and reliably flattened.

As a result, adhesion of the wiring such as the bit line, etc. to the layer, in particular, to the gradation part becomes favorable and wiring of favorable reliability can be formed without disconnection. Also, exposure of the photoresist can be executed according to the designed pattern during the formation of the wiring so the multiple adjacent wiring lines can be formed at the prescribed width and spacing (or pitch).

Therefore, the wiring process can be executed at small size, at high density, and with high degree of margin. In particular, when the design rule becomes strict in regard to minimal line width or spacing (e.g., less than 0.4 $\mu$m), a large margin cannot be obtained in the focusing depth for the exposure during the photolithography but this can be realized to a considerable extent with flattening of the gradation according to our invention and expansion in the process margin can be achieved. As a technology for flattening the gradation, CMP (Chemical Mechanical Polish) can be considered but compared to CMP, the flattening method according to our invention is superior in the fact that it is an extension technology of simply adding necessary processes to the conventional technology, generation of foreign matters is minimal, introduction of new devices is not necessary, etc.

In the manufacturing method of our invention, it is preferable to form the resist layer into a prescribed pattern so that the terminal part is positioned on the step forming a gradation when flattening the gradation, to remove the layer uniformly more by just a prescribed thickness on the high position side than the resist layer by etching with the resist layer as a mask, and they then execute reflow process in a state of having removed the resist layer. In this case, it is preferable to remove the layer uniformly more by just a prescribed thickness on the high position side than the middle height position on the step of the gradation.

Also, it is preferable to anneal the insulation layer (e.g., BPSG layer to be discussed later) having a gradation preliminarily, and flatten the gradation left after the preliminary annealing by the method (namely, to remove the high position side from the arbitrary position on the gradational step by just a prescribed thickness then eliminate the projecting part by heat treatment). At this time, for example, the preliminary annealing can be executed for 10 minutes at 850° C. and the heat treatment (reflow) can be executed for 10 minutes at 900° C. The gradation of about 1.2 $\mu$m can be reduced thereby to about 0.7 $\mu$m.

The manufacturing method of our invention is favorable when flattening the gradation existing between the memory cell array part (e.g., memory cell array part MA to be discussed later) and non-memory cell array part (e.g., peripheral circuit part PC and word strap part WS to be discussed later) in a memory device such as a dynamic RAM. It is also applicable for flattening the gradation existing within the non-memory cell array part.

Even in this case it is preferable to form an insulation layer (e.g., BPSG layer 66 to be discussed later) on the top of the memory cell array part and non-memory cell array part and then, after preliminarily annealing the insulation layer, to flatten the gradation between the memory cell array part and the non-memory cell array part by the process. Even here, the condition for the reflow and preliminary annealing can be similar to what was mentioned above.

Also, it is preferable to form an insulation layer on the memory cell array part and the non-cell memory array part and after preliminarily annealing the insulation layer, to remove the insulation layer more by just a prescribed thickness on the memory cell part side than an arbitrary position on the step forming the first gradation between the memory cell array part and non-memory cell array part, and then immediately thereafter, to remove the insulation layer more by just a prescribed thickness on the high position side than an arbitrary position on the step forming the second gradation existing in the non-memory cell array part , and furthermore, to eliminate each projecting part existing more on the low position side than the arbitrary position of the first and second gradations by heat treatment. Even here, the condition for the heat treatment (reflow) and preliminary annealing can be the same as those mentioned above.

Our invention can also be applied when flattening each gradation existing on the sides of each gate electrode part and between the multiple gate electrode parts by the treatments after forming an insulation layer (e.g., BPSG layer 66 to be discussed later) on the surface containing multiple gate electrode parts and preliminarily annealing the insulation layer in, for example, an ASIC (Application Specific IC). Even here the conditions for the reflow and preliminary annealing can be the same as those mentioned above.

BRIEF DESCRIPTION OF THE DRAWINGS

FIG. 1 is a cross section of the principal part (along line A—A in FIG. 9) showing an element formation step in the manufacturing process for a dynamic RAM according to a first embodiment of our invention.

FIG. 2 is a cross section of the principal part showing a BPSG deposition (1.0 $\mu$m thickness) step.

FIG. 3 is a cross section of the principal part showing an annealing of BPSG(1) step at 850° C. for 10 minutes.

FIG. 4 is a cross section of the principal part showing a step of patterning resist at a gradation part.

FIG. 5 is a cross section of the principal part showing a step of dry etching (0.5 $\mu$m) a memory cell array part side PEB1.

FIG. 6 is a cross section of the principal part showing a resist removal step.

FIG. 7 is a cross section of the principal part showing an annealing of BPSG(2) step at 900° C. for 109 minutes.

FIG. 8 is a cross section of the principal part showing a step for forming metal wiring.

FIG. 9 is a planar pattern for the main part of the dynamic RAM.

FIGS. 10(A)–10(C) are cross sections of a principal part, when the resist pattern terminal part is at the middle of a memory cell array region and a peripheral circuit region, showing 10(A) patterning of a resist, 10(B) dry etching PEB1 (0.5 μm), and 10(C) annealing of BPSG(2).

FIGS. 11(A)–11(C) are cross sections of the principal part, when a resist pattern is within a memory cell array region, showing 11(A) patterning of resist, dry etching PEB1 (0.5 μm), and 11(C) annealing of BPSG(2).

FIGS. 12(A)–12(C) are cross sections of the principal part, when a resist pattern terminal part is within a peripheral circuit region, showing 12(A) patterning of a resist, 12(B), dry etching PEB1 (0.5 μm), and 11(C) annealing of BPSG (2).

FIG. 13 is a cross section of the principal part showing an element formation step in the manufacturing process for a dynamic RAM according to a second embodiment of our invention.

FIG. 14 is a cross section of the principal part showing a BPSG deposition (1.2 μm thickness) step.

FIG. 15 is a cross section of the principal part showing an annealing of BPSG(1) step at 850° C. for 10 minutes.

FIG. 18 is a cross section of the principal part showing a step of patterning resist at a gradation part in a peripheral circuit part.

FIG. 19 is a cross section of the principal part showing a step of dry etching a peripheral circuit part side.

FIG. 20 is a cross section of the principal part showing a resist removal step.

FIG. 21 is a cross section of the principal part showing a step of annealing BPSG(2) at 900° C. for 10 minutes.

FIG. 34 is a cross section of a principal part showing an element forming step in a conventional manufacturing process for a dynamic RAM.

FIG. 35 is a cross section of a principal part showing a step of BPSG deposition (0.6 μm thickness).

FIG. 36 is a cross section of the principal part showing a step of annealing BPSG at 850° C. for 10 minutes.

FIG. 37 is a cross section of the principal part showing a step of forming metal wiring.

Figure 16:
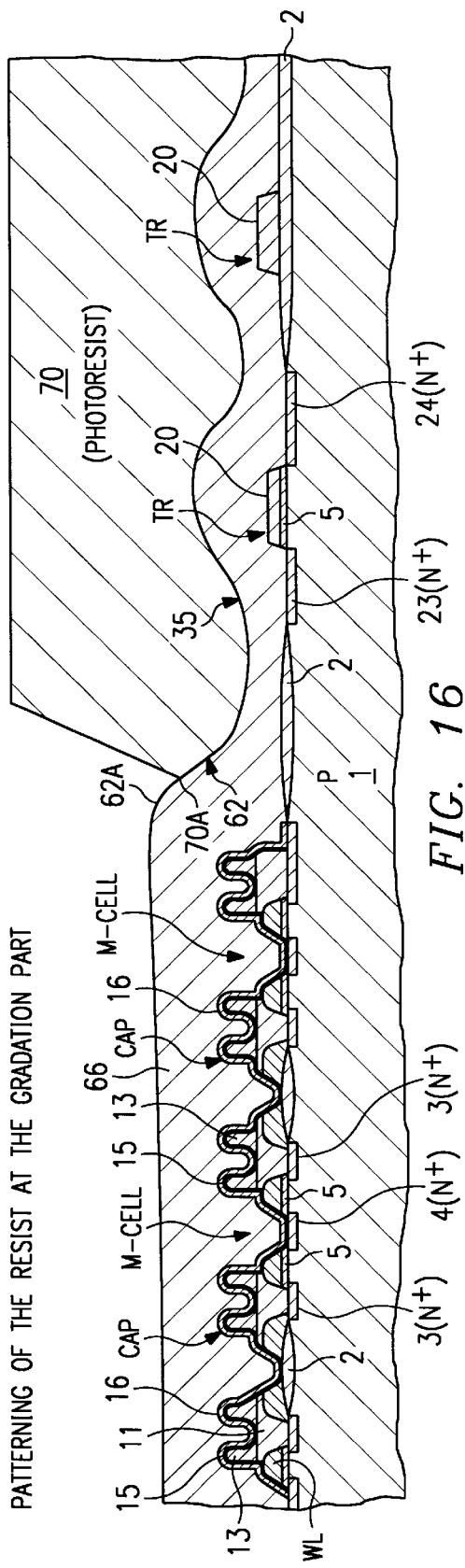
FIG. 16 is a cross section of the principal part showing a step patterning resist at a gradation part.

In the figures, 1 is a substrate; 3, 23 are $n^+$-type source regions; 4, 24 are $n^+$-type drain regions; 6 is a $SiO_2$ layer; 11 is a polysilicon layer (storage node: bottom part electrode); 13, 50 are polysilicon layers; 15 is a dielectric layer; 16 is a polysilicon layer (plate electrode: top part electrode); 20, 90 are gate electrodes; 21 is a local gradation; 22 is a global gradation; 25, 32, 35, 35', 62, 62', 95, 95' are gradations; 35A0, 62A, 95A are steps; 36, 66, 86 are BPSG layers; 49 is a contact hole; 66A, 66B, 86A are projecting parts; 70, 80, 100 are photoresist, 70A, 80A, 100A are resist pattern terminal parts; WL is a word line, BL is a bit line; M-CELL is a memory cell; MA is a memory cell array part; Cap is a cell capacitor; PC is a peripheral circuit part; TR is a transistor; PEB is a pattern etchback; BPSG is boronphosphorsilicate glass; and MW is metal wiring.

DETAILED DESCRIPTION

FIGS. 1–12 show a first embodiment in which our invention is applied to a dynamic RAM.

The manufacturing process of the dynamic RAM according to this embodiment will be explained in relation to FIGS. 1–9.

Figures 1, 2:
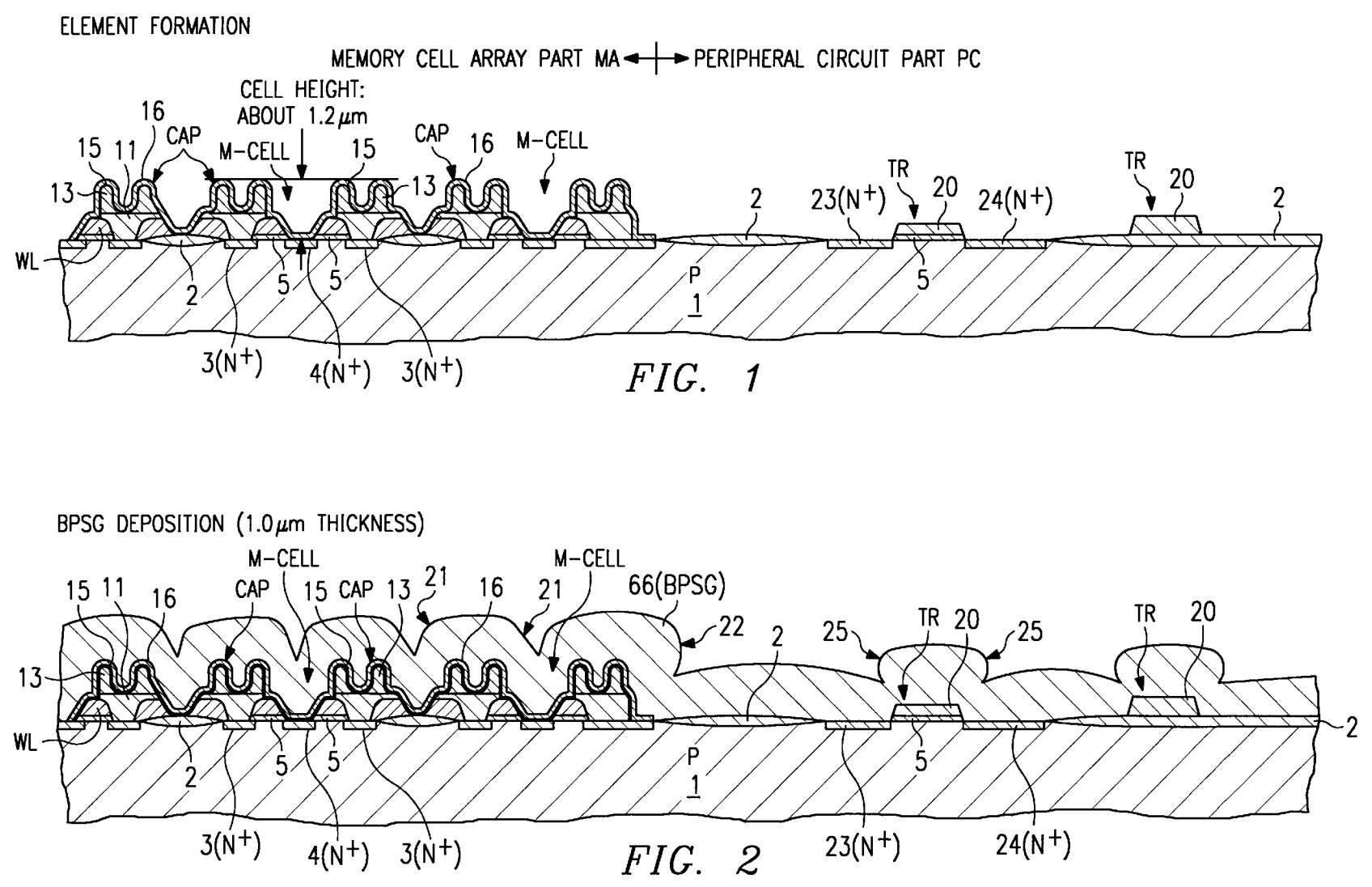

First, FIG. 1 is a cross sectional fig. along line A—A in FIG. 9 (the same process as was discussed in FIG. 34); many memory cells M-CELL (cell height is about 1.2 μm, word line WL spacing is about 0.4 μm, word line WL height is about 3500 Å) appended with stacked cell capacitor Cap shown in FIG. 41 [sic] are formed in an array in memory cell array part MA on one principal surface of p-type silicon substrate 1, and MOS transistors TR for bit line—sense amplifier separation constituting the input/output circuit are formed in peripheral circuit part PC. These transistors have a structure which provided polysilicon gate electrode 20 is provided between $n^+$ source region 23 and $n^+$-type drain region 24.

Figures 34, 35:
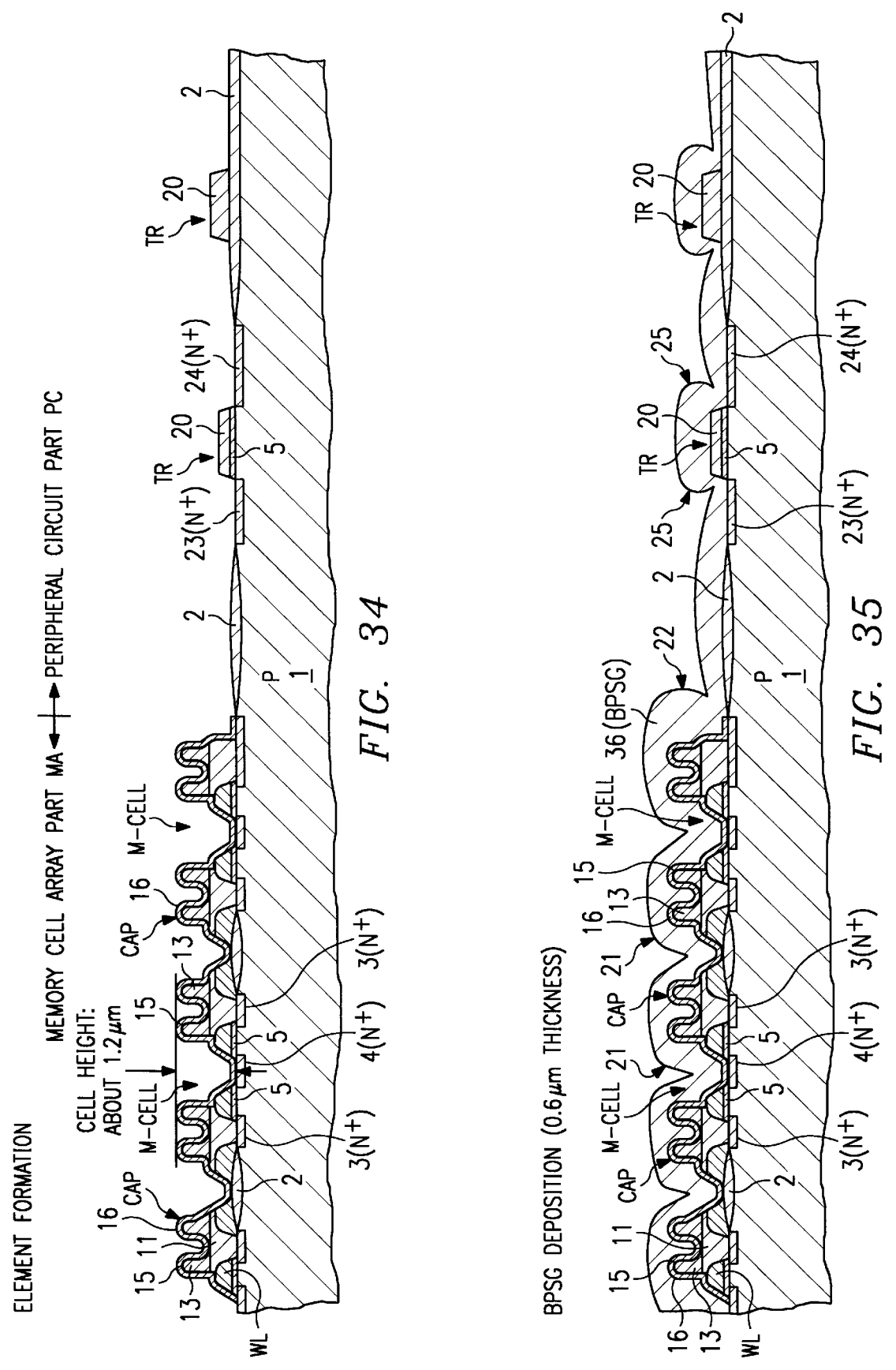

Next, BPSG layer 66 with about 4 wt % of boron and about 5 wt % of phosphorus is deposited to a thickness of 1.0 μm over the entire surface of substrate 1 by the CVD method, as shown in FIG. 2 (same as the process noted in FIG. 35). This thickness is 1 μm after taking the etchback into account (etching amount is 0.5 μm) to be discussed later.

On the surface of the deposition layer 66, along with concave local gradation 21 being created between memory cells M-CELL due to the thickness of word line WL and screen height of cell capacitor Cap in memory cell array part MA, a high structure such as screen structure does not exist on the outside of the terminal part in memory cell array part MA (the distance between gate electrode 20 and word line WL of the memory cell is about 4 μm) so that global gradation 22 steeper than local gradation 21 is created between peripheral circuit part PC and memory cell array part MA.

Even in peripheral circuit part PC, gradation 25 is created on the sides of gate electrode 20 and between gate electrodes 20—20 but the height difference is less than global gradation 22 (however, a height difference greater than or equal to local gradation 21 may occur).

Next, preliminary annealing is executed in an $N_2$ atmosphere for 10 min at 850° C. as shown in FIG. 3, the gradations 21, 22 and 25 are formed with a gentle slope (smoothing), and the BPSG layer is made dense and is stabilized. The conditions for this preliminary annealing were determined to suppress the stress caused by the heat to a minimum by giving consideration to the reflow processing of BPSG to be discussed later.

However, although local gradation 21 is essentially laminated, gradation 25 of peripheral circuit part PC forms a gentle slope like 35, and the steep shape of global gradation 22 becomes a gentle slope, flattening is difficult near global gradation 22 having large height difference. Namely, gradation 62 (this is also a global gradation) with a height difference of about 1.2 $\mu$m is left between memory cell array part MA and peripheral circuit part PC. This global gradation 62 is removed as follows.

First, photoresist 70 coated over the entire surface is exposed and developed into a prescribed pattern, and photoresist 70 is patterned so that terminal part 70A is positioned at the middle position on step 62A of global gradation 62 between memory cell array part MA and peripheral circuit part PC as shown in FIG. 4. The position of the terminal part 70A is shown also in FIG. 9.

Next, the exposed part of BPSG layer 66 is uniformly etched back (hereafter referred to as PEB (pattern etch back)) more on the memory cell array part MA side than global gradation 62 (specifically, terminal part position of resist 70) by dry etching with $CF_4$ gas using photoresist 70 as a mask. With this dry etching as "PEB1," here only 0.5 $\mu$m of BPSG layer 66 is uniformly removed.

Thus, along with reducing the thickness of BPSG layer 66 on memory cell array part MA by half, projecting part 66A formed with one part of step 62A is left in the area of global gradation 62 as shown in FIG. 6 with photoresist 70 removed.

Next, annealing is executed in an $N_2$ atmosphere for 10 min at 900° C. and reflow of BPSG layer 66 is executed as shown in FIG. 7. As a result, the projecting part 66A is fluidized and eliminated, gradation of the peripheral circuit part is also essentially eliminated like 35', and though only a slight (height difference is normally 0.3–0.8 $\mu$m, for example, about 0.7 $\mu$m) gradation 62' remains as global gradation in the area where global gradation 62 existed, this gradation 62' is very small, the surface of BPSG layer 66 is essentially flat, and does not influence the wiring to be discussed later.

Next, as shown in FIG. 8, contact hole 49 is formed at the prescribed location of BPSG layer 66, polysilicon layer 50 is embedded here, then bit line BL is formed on BPSG layer 66 to the prescribed width and pitch.

In this case, the height difference becomes very small in global gradation 62', the gradation of peripheral circuit part PC also has a gentle slope like 35', and the surface of PBSG layer 66 is flat overall, so that the processing of the photoresist which act as the mask during the patterning of bit line BL can be executed with high precision and the short circuiting and disconnection between the bit lines do not occur.

The reason for the superior result is not simply due to executing reflow processing on the BPSG layer as in the conventional technology shown in FIGS. 34–37, but is due to the reflow processing as in FIG. 7 after removing the layer part more on the high position side than middle position 70A (photoresist terminal part) on step 62A formed with global gradation 62 after the preliminary annealing by just a prescribed thickness according to PEB as shown in FIGS. 2–6, so that the height of gradation 66 and thickness of BPSG layer 66 can be reduced in correspondence with the removed thickness part, reflow processing of the remaining projecting part 66A can be performed to maker it smaller, the height difference between the high position part and low position part of BPSG layer 66 can be made significantly smaller, the projecting part 66a can be easily eliminated, and BPSG layer 66 can be flattened sufficiently and reliably.

Therefore, along with the ability to form bit line BL (and other wirings) without disconnection and short-circuiting, exposure of the photoresist can be executed according to the designed pattern when the wiring is formed, so that multiple adjacent wirings can be formed at the prescribed width and spacing (or pitch).

Consequently, the wiring process can be executed finely, at high density, and with a large tolerance. In particular, when the design rule becomes strict with respect to minimal line width or spacing (e.g., less than 0.4 $\mu$m), a large tolerance cannot be obtained in the focusing depth for the exposure during the photolithography but this can be realized to a considerable extent by flattening the global gradation according to the embodiment, thereby realizing an increase in the processing tolerance.

Also, according to the embodiment, flattening of global gradation 62 is executed simply by adding the necessary processes (processes in FIGS. 3–6) to the conventional technology so that it is superior from the standpoint of being an extension of the conventional technology, generating a minimum of foreign matter, not needing to introduce new devices, etc.

Next, the influence of the pattern position of photoresist 70 shown in FIGS. 4 and 5, in particular, in the manufacturing process will be explained in relation to FIGS. 10–12.

FIG. 10 is a case when resist pattern terminal part 70A is positioned at the middle (namely, middle position on step 62A of gradation 62) of the memory cell array region and peripheral circuit region, but PBSG layer 66 is etched back sufficiently by PEB1 and remaining projecting part 66A is also thin and small, so that residual gradation 62' becomes low at about 0.7 $\mu$m and it is apparent that the surface can be flattened sufficiently by reflow processing. In the design rule, the gate electrode of the peripheral circuit part is located at a distance of 4 $\mu$m from word line WL at the outermost terminal of the memory cell array part (hereafter the same).

On the other hand, FIG. 11 shows a case when resist pattern terminal part 70a is positioned within the memory cell array region but BPSG layer 66 of the memory cell array part is etched back by PEB1 and gradation 62 is not etched, so that a considerably thick residual part 66A is left after PEB1, and this residual part is not eliminated even by reflow processing and a considerably high gradation 62' of about 1.0 $\mu$m is left. This does not differ too much from the conventional example discussed in FIG. 36 and forming the wiring with favorable reliability is difficult.

Also, FIG. 12 shows a case when resist pattern terminal part 70A is positioned within the peripheral circuit region but resist pattern terminal part 70A is separated from gradation 62 so that BPSG layer 66 including gradation 62 is simply etched back uniformly by PEB1 and gradation 62' of about 1.0 μm is left even when reflow processing is executed, thus the same problem noted in FIG. 11 is created.

Figure 38:
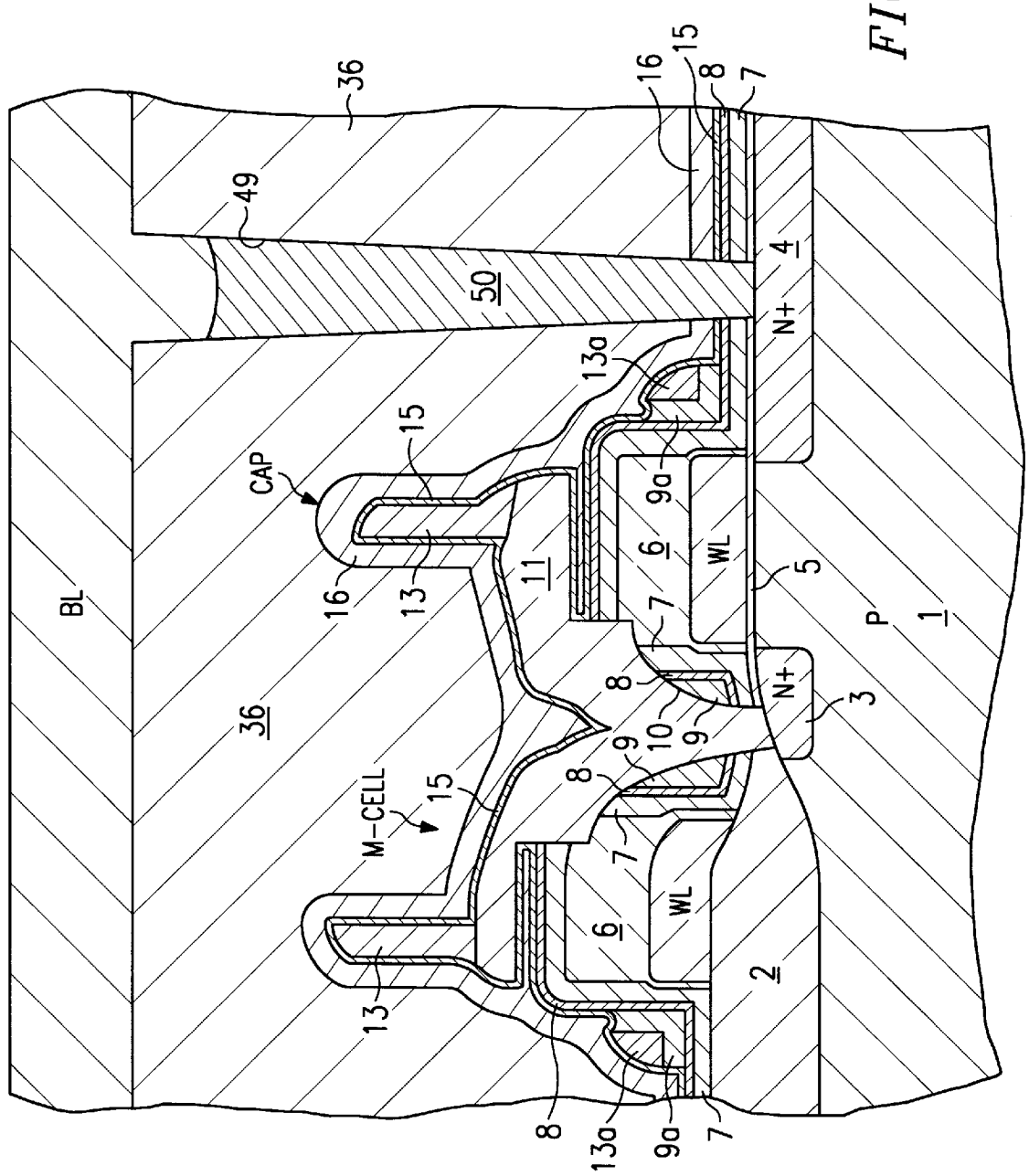
FIG. 38 is an enlarged cross section of a conventional memory cell in a Dynamic RAM.

It is apparent from FIGS. 10–12 that it is necessary to form a pattern in which resist pattern terminal part 70A exists at the middle position on step 62A of gradation 62 as shown in FIG. 10 as a pattern of resist 70 for PEB1. Although it does not matter as long as the position of the resist pattern terminal part 70A is on step 62A of gradation 62, it is preferable to exist within the middle height region corresponding to about ⅓ of the height thereof, and for example, it is preferable to be located about 0.4 μm (refer to FIG. 9) from the storage node (refer to FIG. 38) of the cell capacitor at the outermost terminal of the memory cell array part.

It is possible to deposit a separate BPSG layer (not shown in the figs.) to a thickness of, for example, 0.25 μm by CVD on BPSG layer 66 by including the projecting part 66A after the PEB process shown in the FIGS. 5 and 6 then executing reflow processing in FIG. 7 thereafter. Even in this case, the surface of the BPSG layer can be flattened by reflow processing and total elimination of the influence of the projecting part 66A can be expected.

Also, it is possible to execute total surface wet etching of BPSG layer 66 with, for example, buffered hydrofluoric acid (buffered hydrofluoric acid such as HF+NH$_4$F, etc.) etching 0.25 μm solution after the reflow process shown in FIG. 7 and evenly remove only from BPSG layer 66. Thus, it is possible to reduce the film thickness of BPSG layer 66 and make the formation contact holes 49 simple (refer to FIG. 8) during the subsequent formation of the bit line BL.

FIGS. 13–22 show the second embodiment our invention applied to a dynamic RAM.

Figure 17:
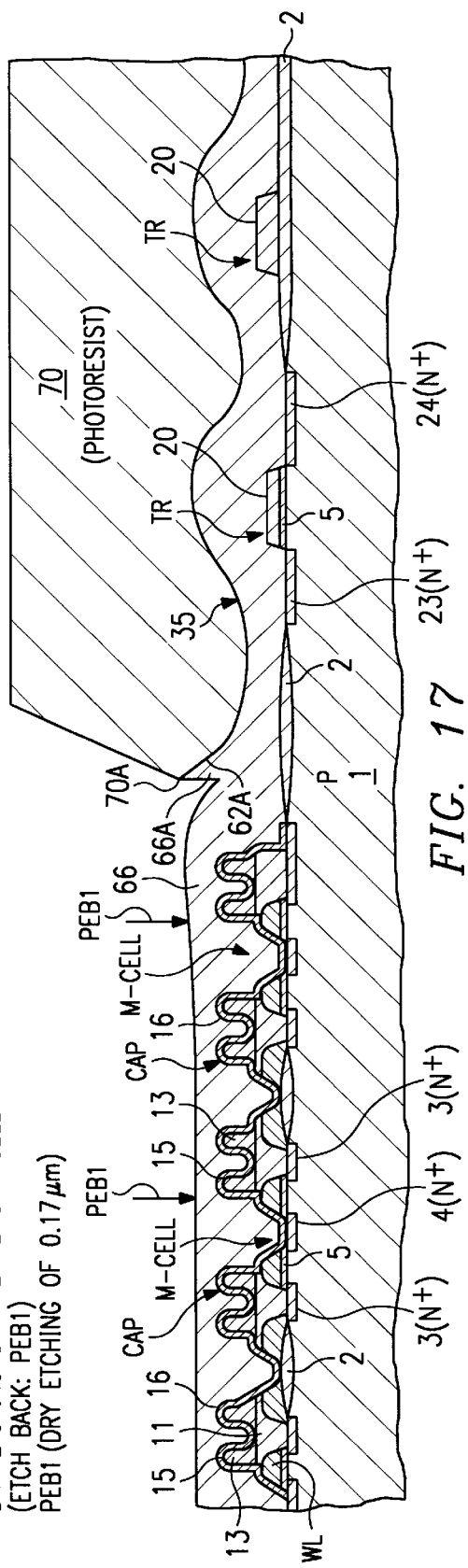
FIG. 17 is a cross section of the principal part showing a step of dry etching on a memory cell array part side (PEB1 0.17 μm).

According to the embodiment, each process shown in FIGS. 13–17 is executed in the same manner as those processes shown in FIGS. 1–5 (however, the thickness of BPSG layer 66 in FIGS. 13–16 is to be 1.2 μm and the etching amount in PEB1 of FIG. 17 is 0.7 μm but the distinct feature is that a process of flattening gradation 35 in peripheral circuit part PC is added.

Namely, photoresist 80 is newly adhered after removing resist 70 and patterning of photoresist 80 is executed so that each terminal part 80A is positioned on step 35A of gradation 35 in peripheral circuit part PC as shown in FIG. 18.

Next, the exposed part of BPSG layer 66 is etched back evenly more on the high position side (gate electrode 20 side) than gradation 35 (specifically terminal part position of resist 80) by dry etching using CF$_4$ gas with photoresist 80 as a mask, as shown in FIG. 19. With this dry etching as "PEB2," here only 0.3 μm of BPSG layer 66 on gate electrode 20 is evenly removed.

Thus, along with reducing the thickness of BPSG layer 66 on gate electrode 20, projecting part 66B formed with one part of step 35A is left in the area where gradation 35 existed as shown in FIG. 20 which removed photoresist 80. The volume and height of the projecting part 66B is quite small.

Next, annealing is executed in an N$_2$ atmosphere for 10 min at 900° C. and reflow processing of BPSG layer 66 is executed as shown in FIG. 21. As a result, the projecting parts 66A and 66B are fluidized and are eliminated and although only a slight (height difference is normally 0.3–0.8 μm, for example, about 0.5 μm) gradation 62' is left as a global gradation in the area where global gradation 62 existed, the gradation 62' is very small, gradation 35 in the peripheral circuit part is almost totally eliminated as in 35', the surface of BPSG layer 66 is essentially and does not influence the wiring to be discussed later.

Figure 22:
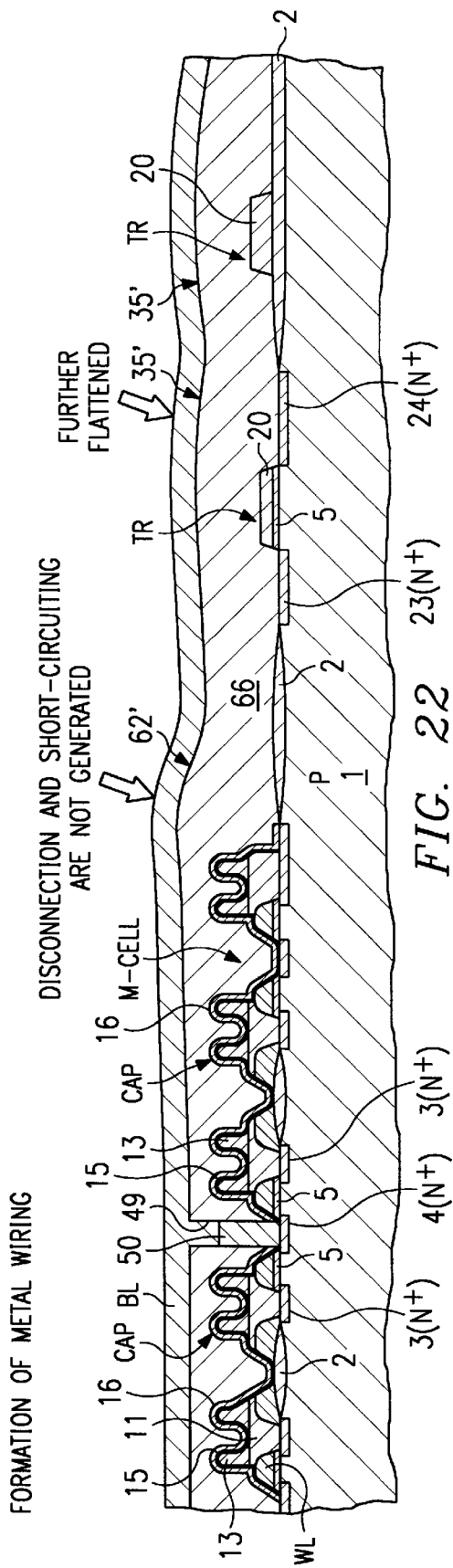
FIG. 22 is a cross section of the principal part showing yet a step for forming metal wiring.

Next, contact hole 49 is formed at the prescribed location of BPSG layer 66, polysilicon layer 50 is embedded here, and bit line BL is formed on BPSG layer 66 to a prescribed width and pitch as shown in FIG. 22.

In this case, global gradation 62' becomes so that the height difference is very small, the gradation of peripheral circuit part PC is also almost totally eliminated as in 35', and the surface of BPSG layer 66 becomes essentially flat so that processing of the photoresist which acts as the mask during the patterning of bit line BL can be executed with high precision and the short--circuiting and disconnection between the bit lines are not generated. In addition, the same superior effects as the first embodiment can be obtained.

In this embodiment, as shown FIGS. 18–21 in addition to global gradation 62 between memory cell array MA and peripheral circuit part PC, gradation 35 existing in peripheral circuit part PC is also almost totally eliminated by the PEB2 and reflow processing so that the surface of BPSG layer 66 can be made flattener, compared to the first embodiment.

Figure 23:
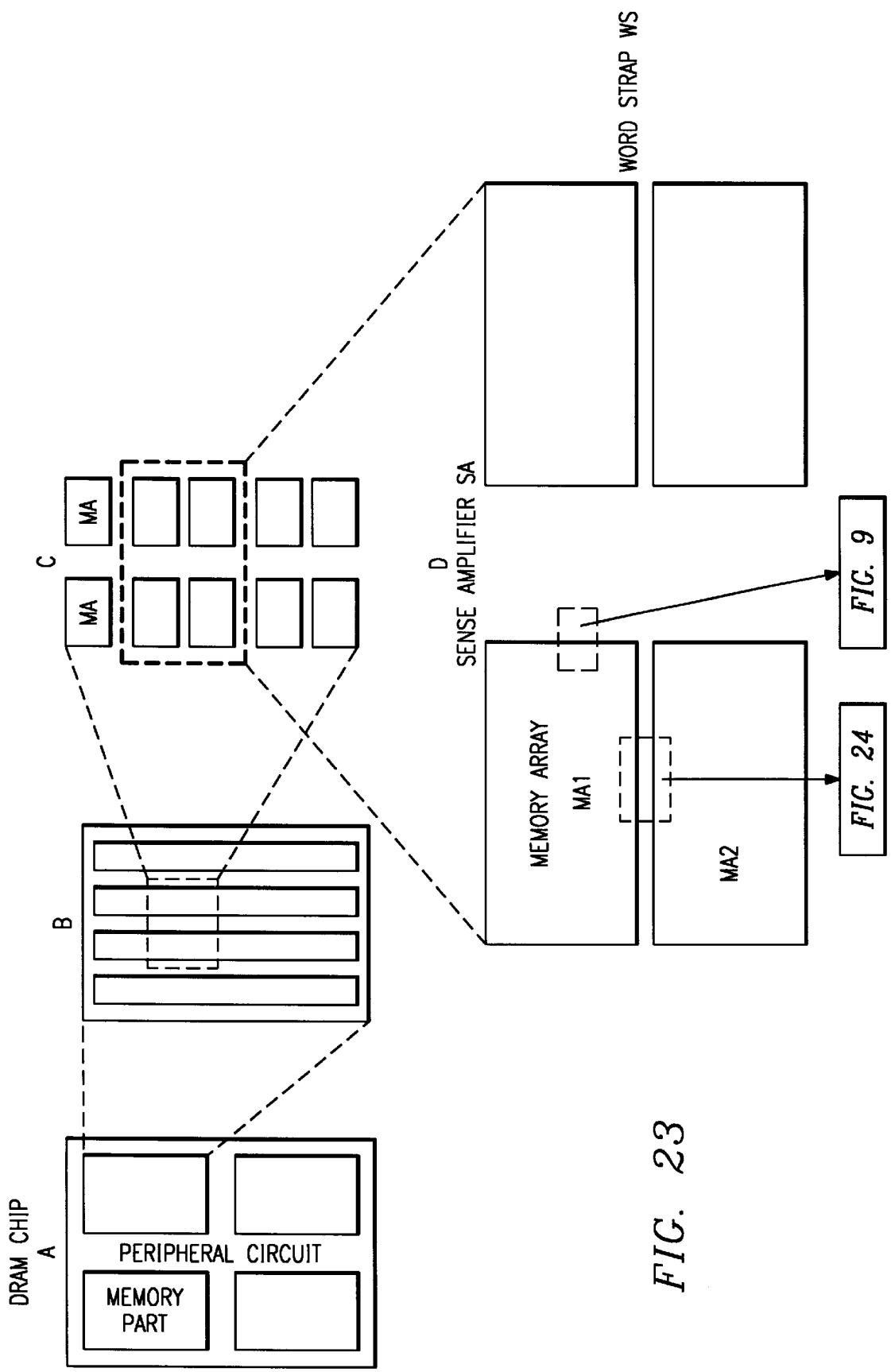
FIG. 23 is a schematic showing the layout of a dynamic RAM according to a third embodiment of our invention.
Figure 24:
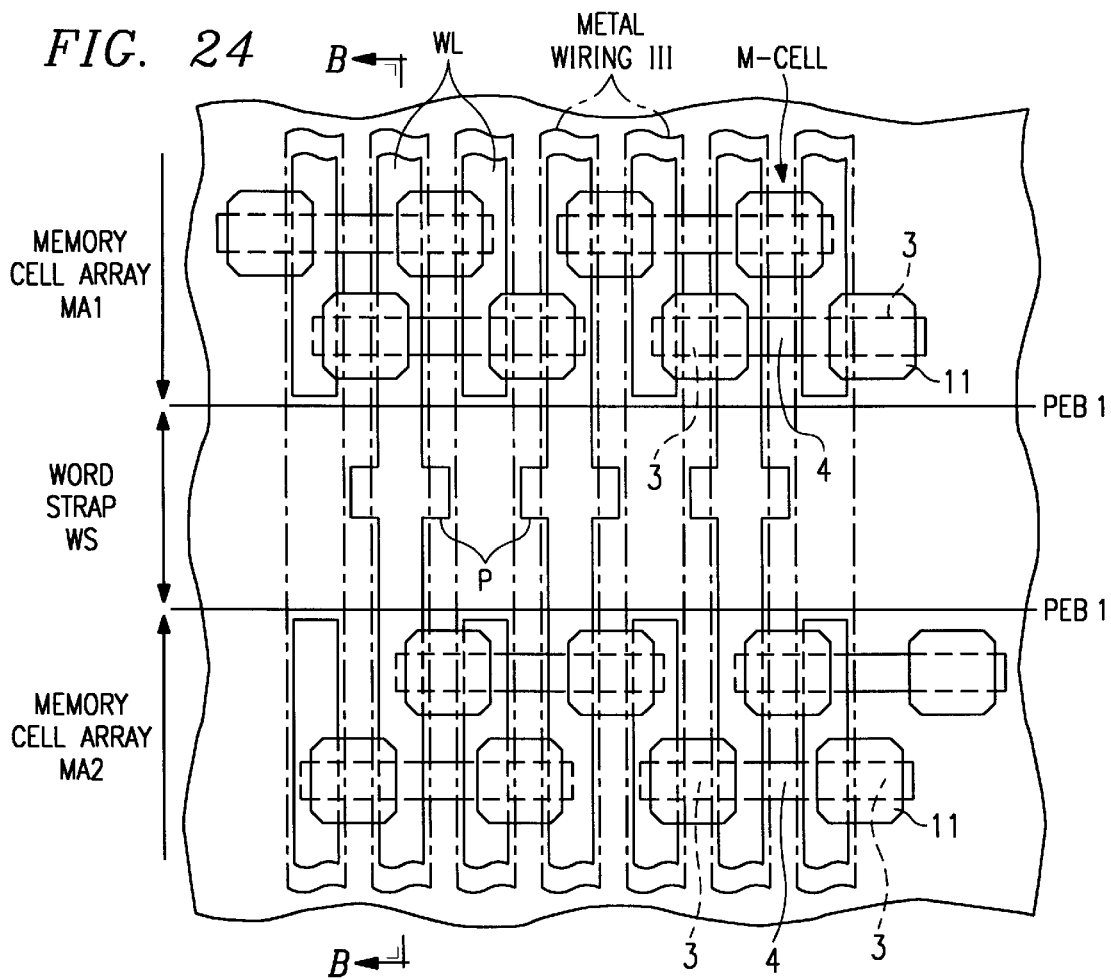
FIG. 24 is a planar pattern for a main part of the dynamic RAM.
Figure 25:
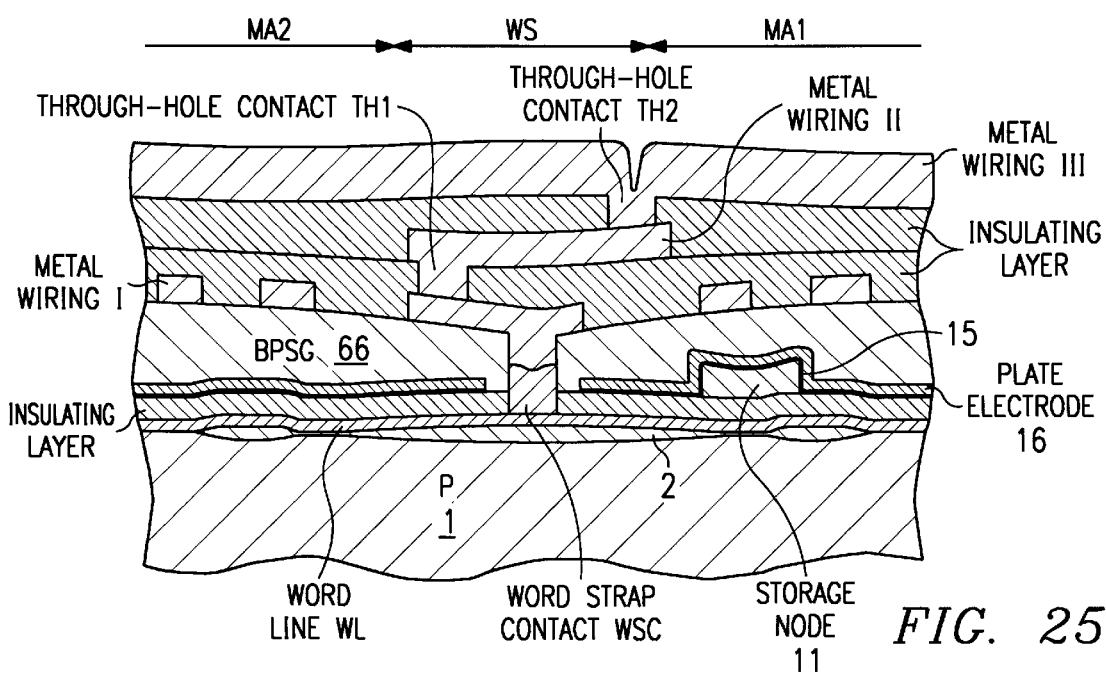
FIG. 25 is a cross section along line B—B in FIG. 24.

FIGS. 23–25 show a third embodiment in which our invention is applied to a dynamic RAM.

FIG. 23 shows the chip layout of a 64 mb dynamic RAM. In FIG. 23, the layout of the entire DRAM chip is indicated in A and greater detail is shown in B and C to the right of the fig. and the smallest structure is D. A partially enlarged layout fig. of memory array part MA and word strap part WS in D is shown in FIG. 24. A partially enlarged layout fig. of sense amplifier part SA and memory array part MA is shown in FIG. 9.

Here, memory array parts MA1 and MA2 are connected by word strap part WS as indicated by C and D in FIG. 23. Word strap part WS is the part lined with a metal wiring in order to decrease the resistance of the word line and, specifically, it is what alternately pulls up the word line to the metal wiring at the uppermost part with a through hole for each of the 64 bits.

The pattern of word line WL is shown in a simplified representation in FIG. 24 since a detailed top view showing the format pattern with respect to word strap part WS would be complicated; sectional fig. along line B—B of word strap part WS and memory array parts MA1 and MA2 is shown in FIG. 25. Center convex part P in word line WL of FIG. 24 is the part for providing word strap contact WSC.

Namely, a constitution of being connected to metal wiring III of the uppermost layer indicated by the imaginary line in FIG. 24 via through hole contact TH2 is formed after connecting to metal wiring I via word strap contact WSC from word line WL of the bottommost layer in FIG. 25 and connecting to metal wiring II via through hole contact TH1. A control signal is input to each word line from metal wiring III. Each contact is executed via the insulation layer such as BPSG layer 66, etc. Then by executing the same processes noted in FIGS. 1–8 along the line PEBI in FIG. 24, it is possible to flatten the gradation between memory cell array part MA and word strap part WS.

In the flattening process, the word strap part does not have a storage node, so that the height difference (gradation) between the memory cell array part is about 0.65 μm, but it has been verified that when PEB is arranged as described above, it is possible to reduce the height difference to about 0.2 μm.

FIGS. 26–33 show a fourth embodiment in which our invention is applied to an ASIC (application specific IC).

Figure 26:
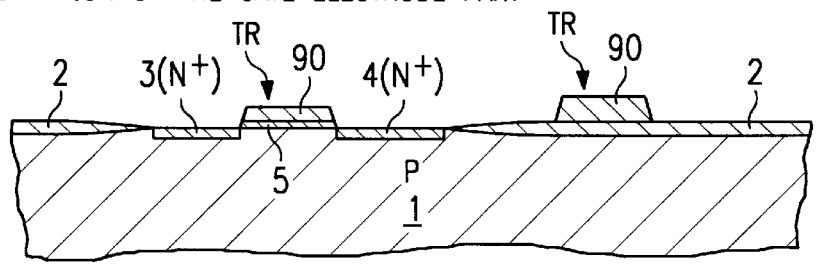
FIG. 26 is a cross section according to a fourth embodiment of our invention of a principal part showing a step of forming an gate electrode part of a semiconductor device.

According to this embodiment, polysilicon gate electrode 90 is formed on p-type silicon substrate 1 to a prescribed width and spacing, as shown in FIG. 26, in order to reduce the gradation between the gate electrodes in the ASIC. Parts 2, 3, 4, and 5 in the figure are a field oxide film, $n^+$-type source region, $n^+$-type drain region, and gate oxide film respectively.

Figure 27:
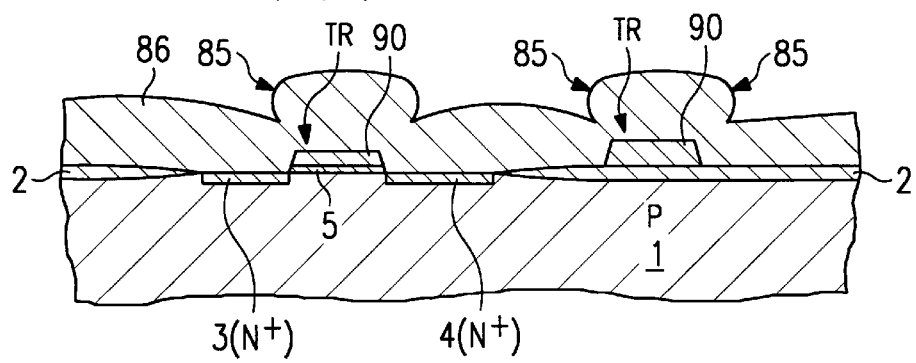
FIG. 27 is a cross section of the principal part showing a step of BPSG deposition (1.2 μm).

Next, BPSG layer 86 with about 4 wt % of boron and about 5 wt % of phosphorus is deposited over the entire surface of substrate 1 to a thickness of 1.2 $\mu$m by the CVD method as shown in FIG. 27. This thickness is 1.2 $\mu$m because of the etchback (etching amount is 0.5 $\mu$m to be discussed later. On the surface of the deposition layer 86, gradation 85 is created on the sides of gate electrode 90 due to the thickness of gate electrode 90, etc.

Figure 28:
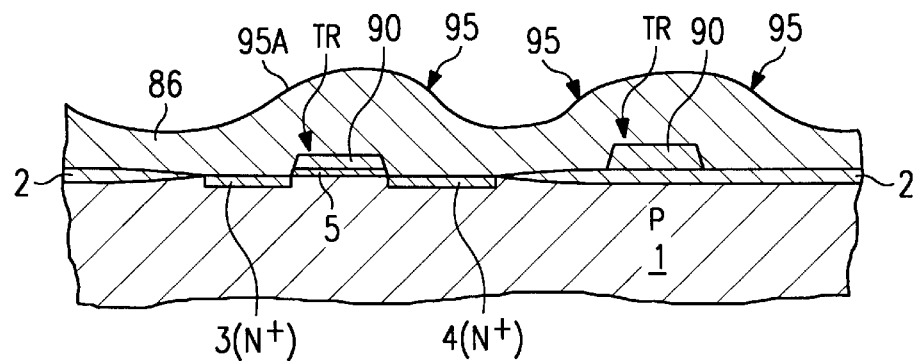
FIG. 28 is a cross section of the principal part showing a step of annealing BPSG(1) at 850° C. for 10 minutes.

Next, preliminary annealing is executed in an $N_2$ atmosphere for 10 min at 850° C. and each gradation is made into a gentle slope (smoothing) like 95, as shown in FIG. 28. The conditions for the preliminary annealing were determined to suppress the stress caused by heat history to a minimum taking into account the reflow process of the BPSG to be discussed later.

Figure 29:
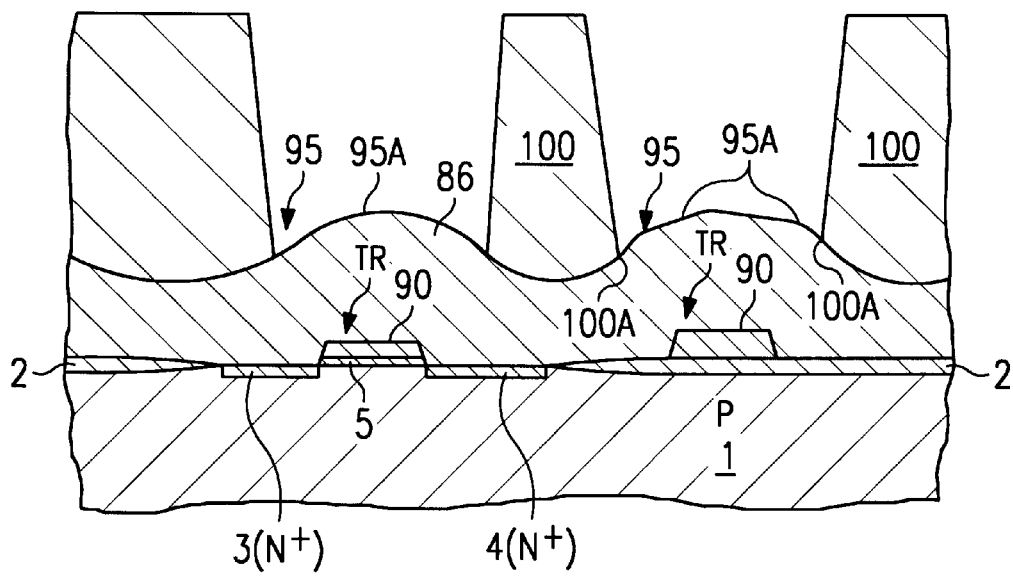
FIG. 29 is a cross section of the principal part showing a resist patterning step.

Next, photoresist 100 coated over the entire surface is exposed and developed to from a prescribed pattern and photoresist 100 is patterned so that terminal part 100A is located at the middle position on step 95A of gradation 95 as shown in FIG. 29.

Figure 30:
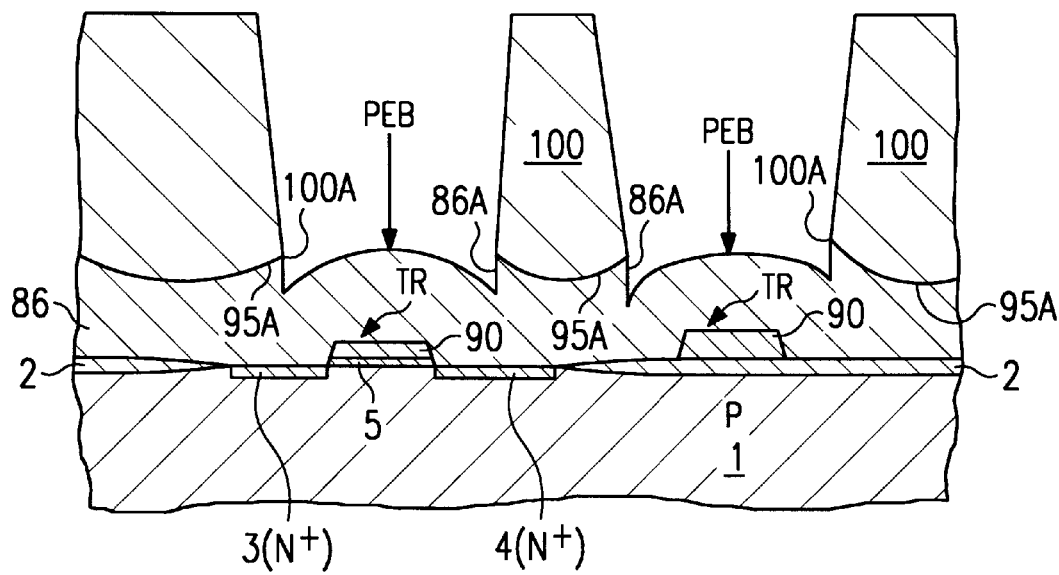
FIG. 30 is a cross section of the principal part showing a step of PEB dry etching (0.3 μm).

Next, the exposed part of BPSG layer 86 is etched back PEB evenly more on the high position side than gradation 95 (specifically, terminal position of resist 100) by dry etching using $CF_4$ gas with photoresist 100 as a mask, and only 0.3 $\mu$m of BPSG layer 86 is removed uniformly as shown in FIG. 30.

Figure 31:
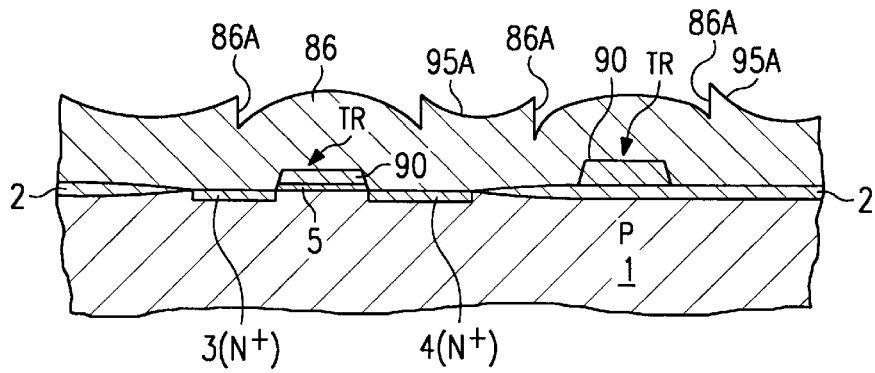
FIG. 31 is a cross section of the principal part showing resist removal step

Thus, projecting part 86A formed by one part of step 95A is left in the area where gradation 95 existed as shown in FIG. 31 which removed photoresist 100. The height and volume of the projecting part 86A are not that large.

Figure 32:
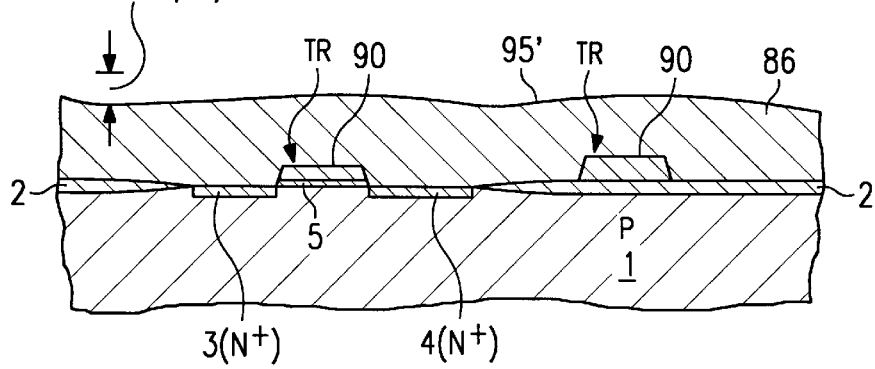
FIG. 32 is a cross section of the principal part showing a step of annealing of BPSG(2) at 900° C. for 10 minutes.

Next, annealing is executed in an $N_2$ atmosphere for 10 min at 900° C. and BPSG layer 86 is subjected to reflow previously as shown in FIG. 32. As a result, the projecting part 86A is melted and removed and only slight (height difference is normally 0.3–0.8 $\mu$m, for example, 0.5 $\mu$m) gradation 95' is left as a gradation in the area where gradation 95 existed, but the gradation 95' is very small, the surface of BPSG layer 86 is essentially flattened, and does not influence the wiring to be discussed later.

Figure 33:
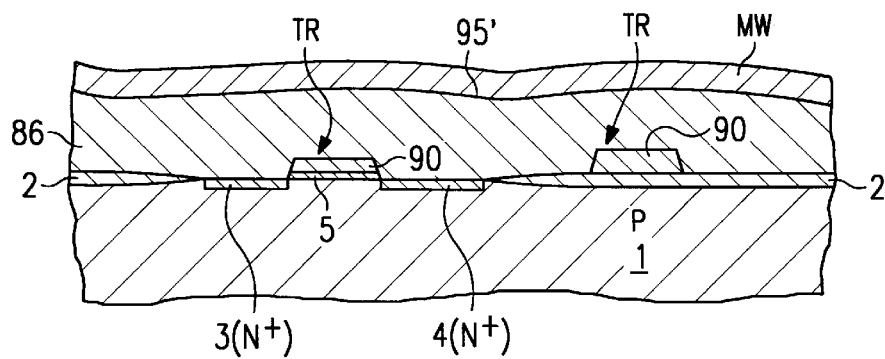
FIG. 33 is a cross section of the principal part showing a step for forming metal wiring.

Next, metal wiring MW is formed on BPSG layer 86 to a prescribed width and pitch, as shown in FIG. 33.

In this case, height difference of gradation 95' becomes quite small and the surface of BPSG layer 86 is essentially flat overall, so that processing of the photoresist which acts as the mask during the patterning of metal wiring MW can be executed with high precision and the short-circuiting and disconnection between the metal wirings are not generated. In addition, the same superior effects of the first embodiment can be obtained.

Above, embodiments of our invention were explained but the embodiments can be further modified based on the technological concept of our invention.

For example, in addition to the conditions for reflow processing, PEB, and preliminary annealing, the pattern shape of the photoresist and the terminal part position can be changed. It is preferable to execute PEB with dry etching due to the problem of undercutting below the resist.

Also, in addition to the gradations indicated in the examples, the flattening method according to our invention is an effective method when flattening the gradations which exist in various regions of the semiconductor device, in particular, when flattening gradations with height difference of 1 $\mu$m or more to 0.3–0.8 $\mu$m or less.

Also, the layer which becomes the flattening target is not limited to aforementioned BPSG layer but can of course, be wiring layers, etc.

In addition to the dynamic RAM having stacked cell capacitor configuration, our invention can be applied to cases when the conductivity type of the semiconductor region is changed or to other devices and other semiconductor memories.

As explained above in our invention only a prescribed thickness of the layer part is removed more on the high position side than an arbitrary position of the step of the gradation formed with a high position part and a low position part, then the projecting part which exists more on the low position side than the arbitrary position of the gradation is eliminated by subsequent heat treatment, so that the heat treatment can be executed when made the height of the gradation and the thickness of the layer are reduced in correspondence with the removed thickness.

Therefore, the volume (volume determined by the height, width, and length of the projecting part which exists (i.e., left after removing the layer part by only a prescribed thickness) more on the low position side than the arbitrary position of the gradation is small during the heat treatment, so that the projecting part is easily eliminated by the heat treatment, the height difference of the high position part and low position part can be made significantly small, and the layer can be flattened sufficiently and reliably.

As a result, the multiple adjacent wirings can be formed with a prescribed width and spacing (or pitch) since exposure of the photoresist can be executed according to the designed pattern during the formation of the wiring.

Therefore, it is possible to execute the wiring process finely, in high density, and with a large tolerance. In particular, when the design rule becomes strict, requiring a minimum line width or spacing (e.g., below 0.4 $\mu$m), a large tolerance cannot be obtained in the focusing depth for the exposure during the photolithography, but can be realized to a considerable extent by flattening the gradation according to our invention and the processing tolerance can be increased.

Also, the method according to our invention is superior from the standpoint of being an extension technology by simply adding the necessary processes to the conventional technology, minimum generation of foreign matter, not needing to introduce new devices, etc.

We claim:

1. A method for manufacturing a semiconductor device, comprising the steps of:

removing a layer part more on the high position than an arbitrary position on a step forming a gradation when flattening a layer with a gradation formed of a high position part and a low position part; and eliminating a projecting part existing more on the low position side than the arbitrary position of the gradation by heat treatment.

2. The method of claim 1 in which a resist layer is formed into a pattern so that the resist pattern terminal part is positioned on the step forming a gradation, uniformly removes the layer more on the high position side than the resist layer by etching with the resist layer as a mask, then a reflow process is performed after having removed the resist layer.

3. The method of claim 1 in which the layer is uniformly removed more on the high position side than the middle height position on the step forming a gradation.

4. The method of claim 1 in which an insulation layer having a gradation is preliminarily annealed and the gradations left after the preliminary annealing are flattened.

5. A method of claim 1 in which the gradation existing between a memory cell array part and a non-memory cell array part are flattened.

6. The method of claim 1 in which the gradation existing within the non-memory cell array part are flattened.

7. The method of claim 5 in which the non-memory cell array part is a peripheral circuit part or a word line strap part.

8. The method of claim 5 in which an insulation layer is formed on the memory cell array part and the non-memory cell array part, and after preliminarily annealing this insulation layer, the gradations between the memory cell array part and the non-memory cell array part are flattened.

9. The method of claim 8 in which an insulation layer is formed on the memory cell array part and the non-cell memory array part and after preliminarily annealing the insulation layer, the insulation layer is removed more on the memory cell part side than in an arbitrary position on the step formed with the first gradation between the memory cell array part and non-memory cell array part; then immediately thereafter, the insulation layer is removed more on the high position side than at an arbitrary position on the step forming the second gradation existing in the non-memory cell array part, is removed more, and furthermore, each projecting part more on the low position side than the arbitrary position of the first and second gradations is eliminated by heat treatment.

10. A method of claim 1 for manufacturing a semiconductor device which forms an insulation layer on a surface containing multiple gate electrodes and after preliminarily annealing the insulation layer each gradation existing on the sides of each gate electrode and between the multiple gate electrode is flattened.

11. A method for manufacturing a semiconductor device, comprising the steps of:

applying a deposition layer over a semiconductor device;

preliminary annealing the deposition layer to cause reflow of the deposition layer, applying a resist layer on a portion of the deposition layer with the portion edge near a global gradation;

etching the remaining exposed deposition layer to reduce the thickness of the exposed deposition layer resulting in a projecting part of deposition layer at an edge of the resist layer, and eliminating the projecting part of the deposition layer by heat treatment.

12. The method of claim 11 in which the deposition layer is a layer of BPSG applied by chemical vapor deposition.

13. The method of claim 12 in which the gradation existing between a memory cell array part and an non-memory cell array part are flattened.

14. The method of claim 13 in which the non-memory cell array part is a peripheral circuit part or a word line strap part.

15. The method of claim 11 for manufacturing a for semiconductor device which forms an insulation layer on a surface containing multiple gate electrodes and after preliminarily annealing the insulation layer each gradation existing on the sides of each gate electrode and between the multiple gate electrode is flattened.

* * * * *